US010262927B2

(12) United States Patent
Hasegawa et al.

(10) Patent No.: US 10,262,927 B2
(45) Date of Patent: Apr. 16, 2019

(54) SEMICONDUCTOR DEVICE AND MANUFACTURING METHOD THEREOF

(71) Applicant: Renesas Electronics Corporation, Tokyo (JP)

(72) Inventors: Kazunori Hasegawa, Takasaki (JP); Hiroi Oka, Takasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/558,977

(22) PCT Filed: Jul. 23, 2015

(86) PCT No.: PCT/JP2015/071043
§ 371 (c)(1),
(2) Date: Sep. 15, 2017

(87) PCT Pub. No.: WO2017/013808
PCT Pub. Date: Jan. 26, 2017

(65) Prior Publication Data
US 2018/0247884 A1    Aug. 30, 2018

(51) Int. Cl.
*H01L 23/00* (2006.01)
*H01L 23/495* (2006.01)
(Continued)

(52) U.S. Cl.
CPC .... *H01L 23/49513* (2013.01); *H01L 21/4825* (2013.01); *H01L 21/52* (2013.01);
(Continued)

(58) Field of Classification Search
CPC . H01L 2224/29139; H01L 2224/13139; H01L 2224/85439; H01L 2224/48839;
(Continued)

(56) References Cited

U.S. PATENT DOCUMENTS

2009/0189264 A1    7/2009  Yato et al.
2010/0187678 A1    7/2010  Kajiwara et al.
(Continued)

FOREIGN PATENT DOCUMENTS

JP    2009-206482 A    9/2009
JP    2010-171271 A    8/2010
(Continued)

OTHER PUBLICATIONS

International Search Report (ISR) (PCT Form PCT/ISA/210), in PCT/JP2015/071043, dated Oct. 13, 2015.
(Continued)

*Primary Examiner* — Roy Potter
(74) *Attorney, Agent, or Firm* — McGinn I. P. Law Group, PLLC

(57) ABSTRACT

Reliability of a semiconductor device is improved. For this, embodied is a basic idea that a semiconductor chip (CHP1) mounted on an Ag layer (AGL) is fixed by using a temporarily fixing material (TA) having tackiness without forming the temporarily fixing material (TA) on a surface of the Ag layer (AGL) having a porous structure as much as possible, is realized. More specifically, the temporarily fixing material (TA) is supplied so as to have a portion made in contact with a chip mounting part (TAB), and the semiconductor chip (CHP1) is also mounted on the Ag layer (AGL) so that one portion of a rear surface of the semiconductor chip (CHP1) is made in contact with the temporarily fixing material (TA).

18 Claims, 21 Drawing Sheets

(51) Int. Cl.
*H01L 21/52* (2006.01)
*H01L 21/48* (2006.01)
*H01L 23/31* (2006.01)

(52) U.S. Cl.
CPC .... *H01L 23/3114* (2013.01); *H01L 23/49524* (2013.01); *H01L 23/49562* (2013.01); *H01L 23/49575* (2013.01); *H01L 24/29* (2013.01); *H01L 24/32* (2013.01); *H01L 24/40* (2013.01); *H01L 24/48* (2013.01); *H01L 24/73* (2013.01); *H01L 24/83* (2013.01); *H01L 24/45* (2013.01); H01L 2224/0603 (2013.01); H01L 2224/29139 (2013.01); H01L 2224/32245 (2013.01); H01L 2224/371 (2013.01); H01L 2224/37147 (2013.01); H01L 2224/37599 (2013.01); H01L 2224/40137 (2013.01); H01L 2224/40139 (2013.01); H01L 2224/40245 (2013.01); H01L 2224/45124 (2013.01); H01L 2224/45144 (2013.01); H01L 2224/45147 (2013.01); H01L 2224/48245 (2013.01); H01L 2224/48247 (2013.01); H01L 2224/49171 (2013.01); H01L 2224/73221 (2013.01); H01L 2224/73263 (2013.01); H01L 2224/73265 (2013.01); H01L 2224/83002 (2013.01); H01L 2224/8384 (2013.01); H01L 2224/83192 (2013.01); H01L 2924/1203 (2013.01); H01L 2924/13055 (2013.01); H01L 2924/14252 (2013.01); H01L 2924/181 (2013.01)

(58) Field of Classification Search
CPC ......... H01L 23/49513; H01L 23/49562; H01L 23/49575; H01L 24/29; H01L 24/32; H01L 24/40; H01L 24/48; H01L 24/73; H01L 24/83; H01L 21/4825; H01L 23/3114
See application file for complete search history.

(56) References Cited

U.S. PATENT DOCUMENTS

| | | | |
|---|---|---|---|
| 2011/0192630 A1 | 8/2011 | Ishino et al. | |
| 2011/0290863 A1* | 12/2011 | Kajiwara | B22F 3/22 228/227 |
| 2013/0183535 A1* | 7/2013 | Konno | H01L 23/295 428/457 |
| 2013/0328204 A1* | 12/2013 | Zommer | B23K 1/20 257/765 |
| 2014/0264383 A1 | 9/2014 | Kajiwara et al. | |
| 2018/0190593 A1* | 7/2018 | Gaines | H01L 23/552 |

FOREIGN PATENT DOCUMENTS

| | | |
|---|---|---|
| JP | 2011-165871 A | 8/2011 |
| JP | 2011-249801 A | 12/2011 |
| JP | 2013-041884 A | 2/2013 |
| JP | 2013-229561 A | 11/2013 |
| JP | 2014-127537 A | 7/2014 |
| JP | 2014-179541 A | 9/2014 |
| WO | WO 2009/081648 A1 | 7/2009 |

OTHER PUBLICATIONS

Japanese Office Action, dated Jul. 31, 2018 in Japanese Application No. 2017-529432 and English Translation thereof.

* cited by examiner

FIG. 2
(a)
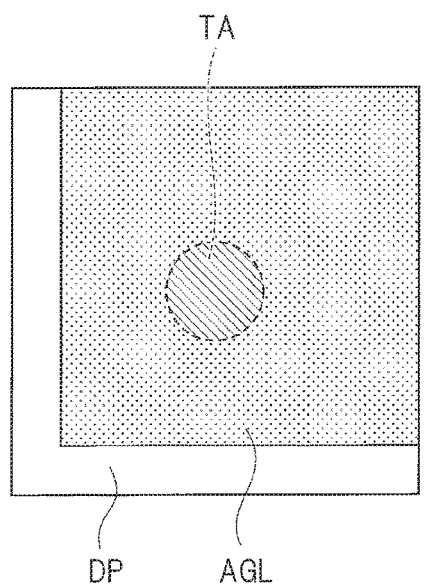
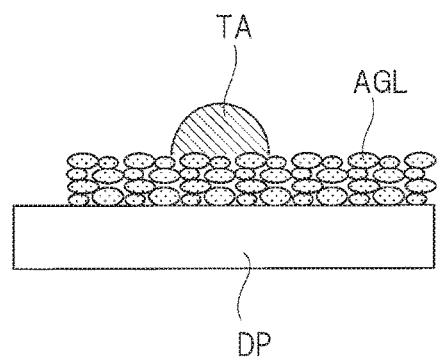
(b)
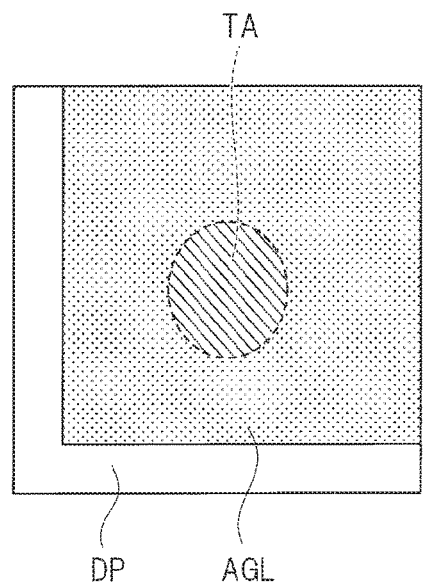
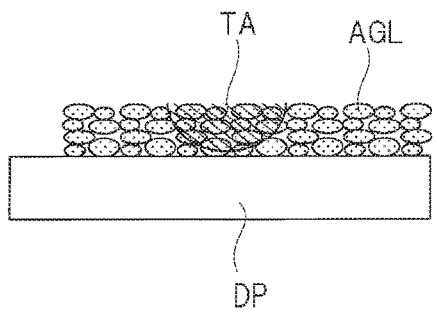

FIG. 9
(a)
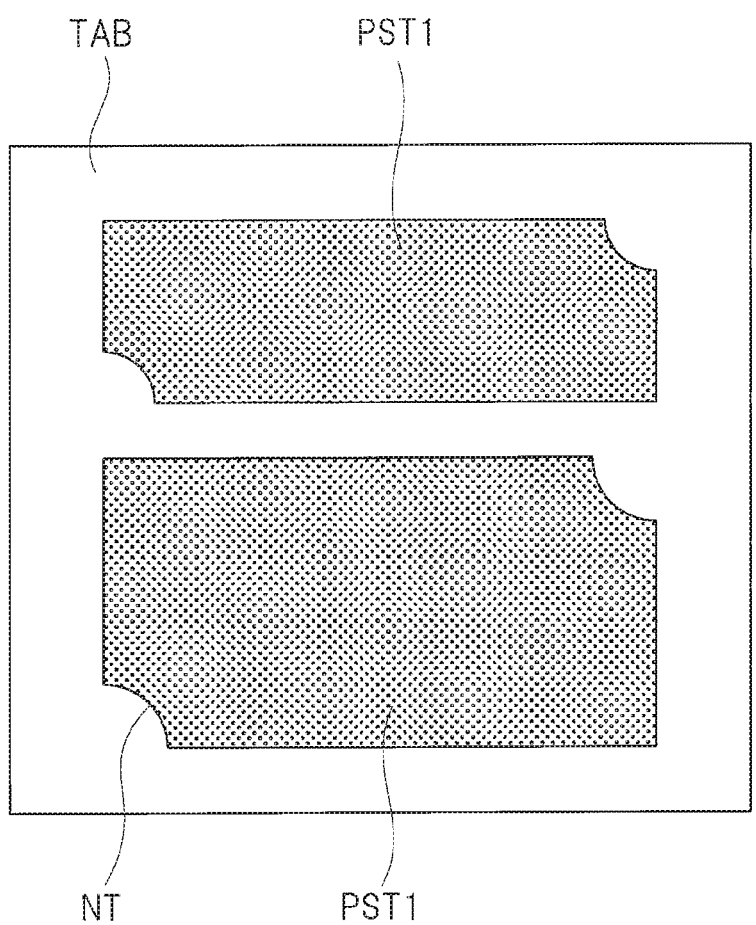
(b)
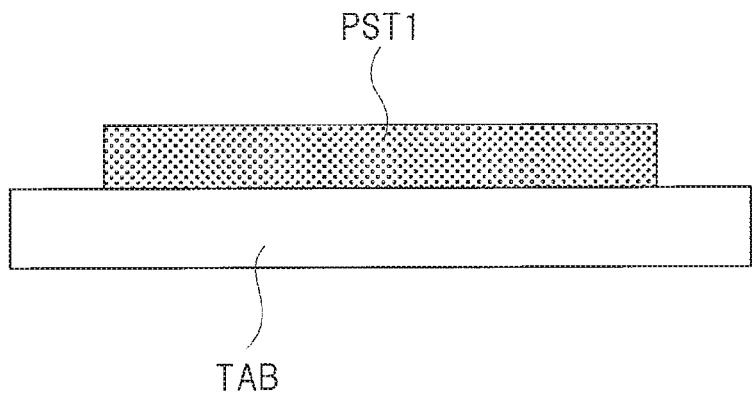

FIG. 10
(a)
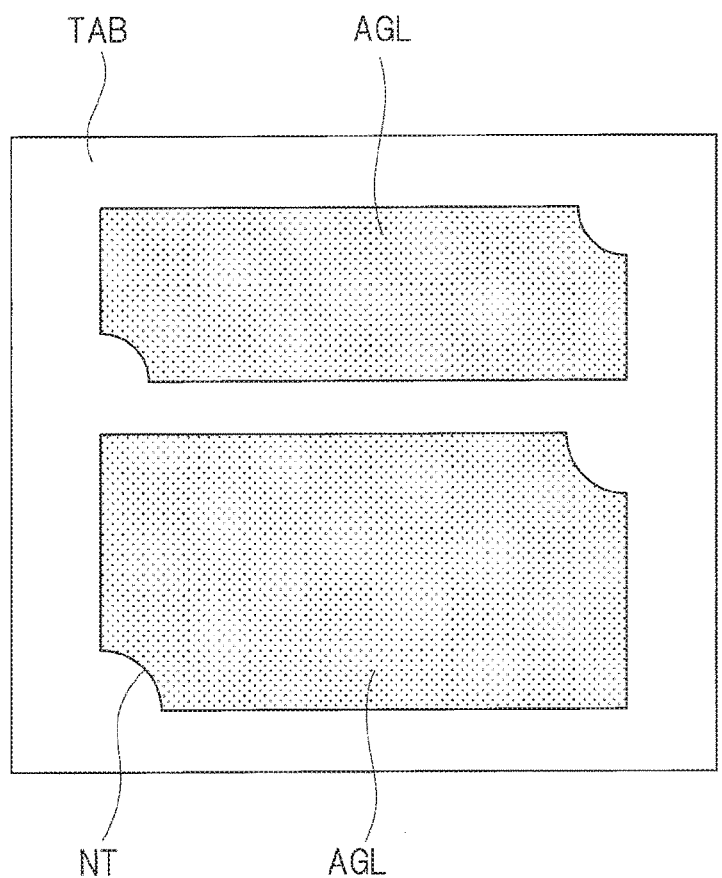
(b)
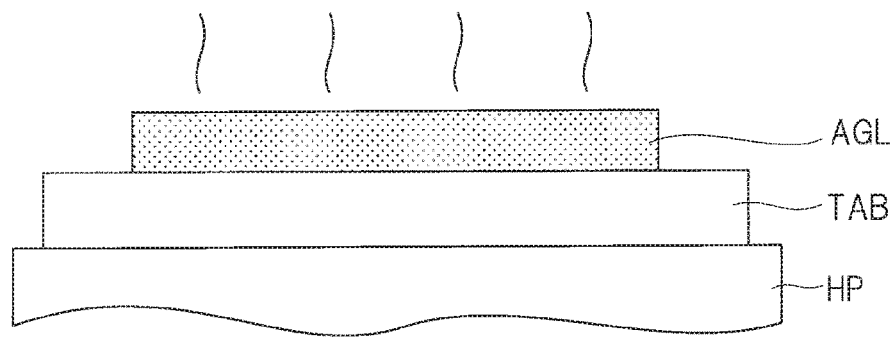

FIG. 11
(a)
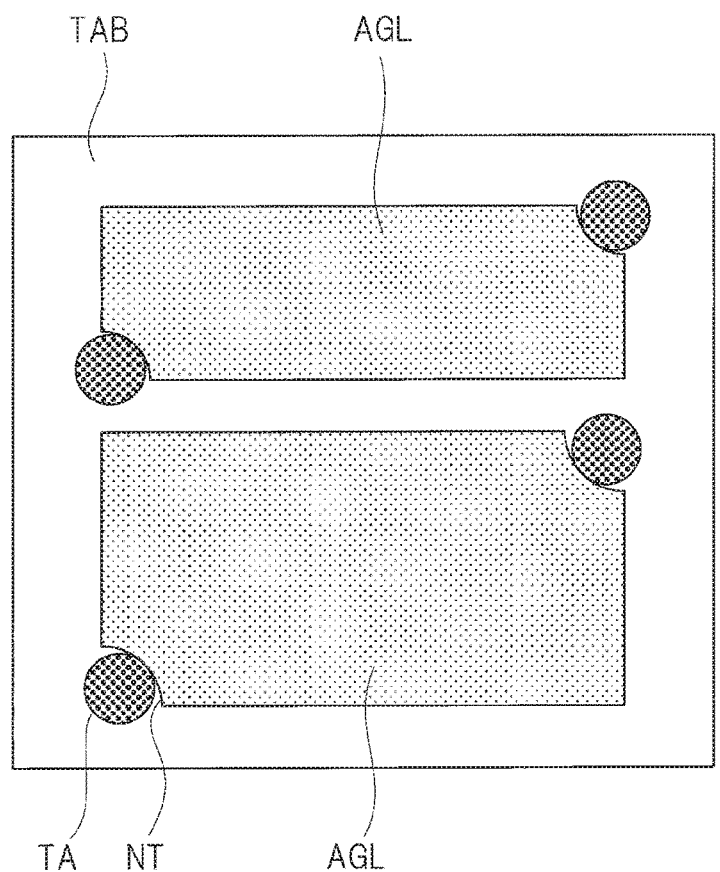
(b)
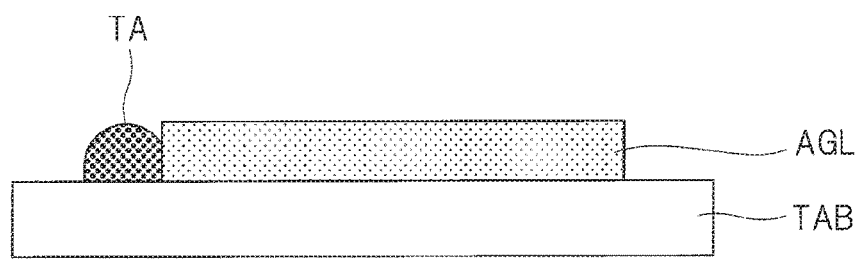

FIG. 12
(a)
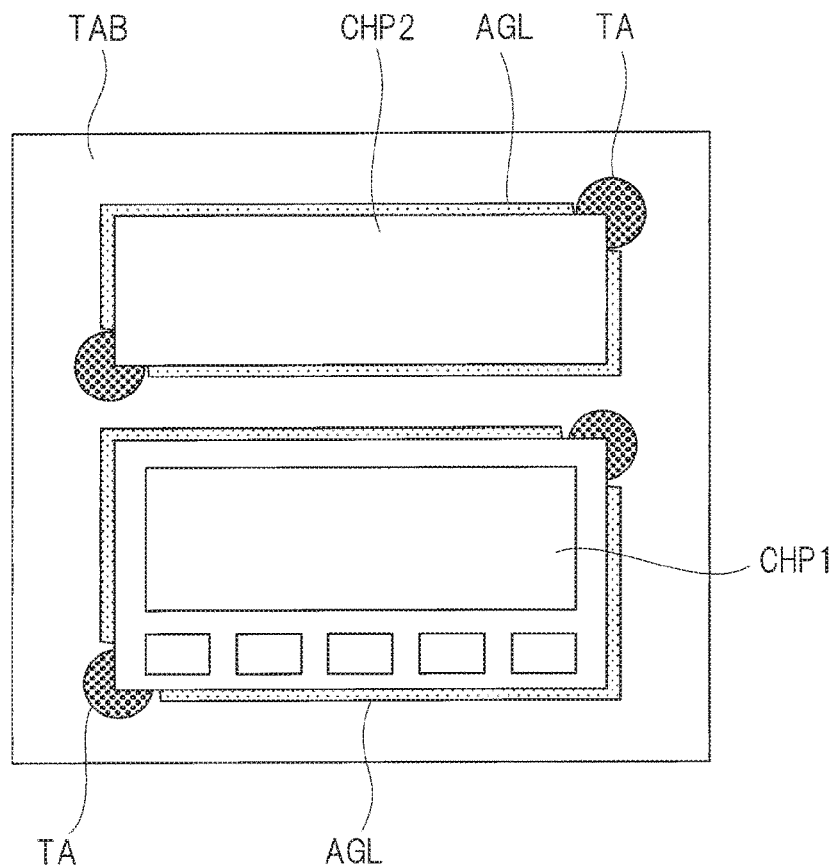
(b)
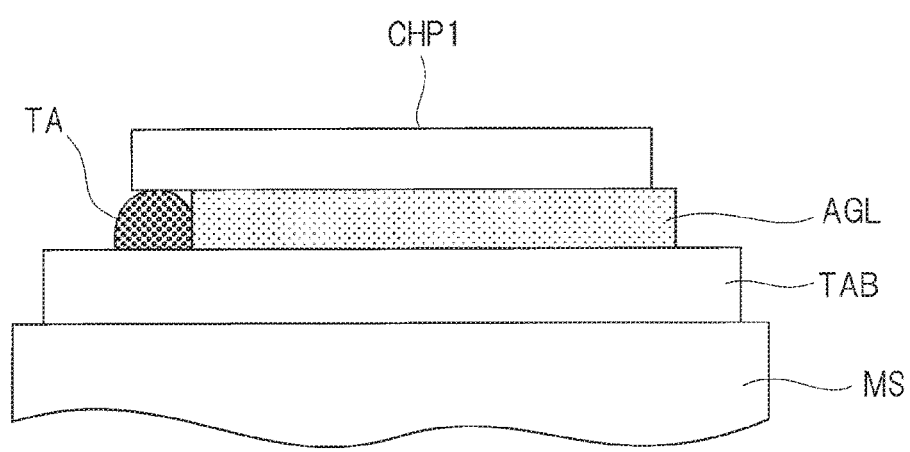

FIG. 13
(a)
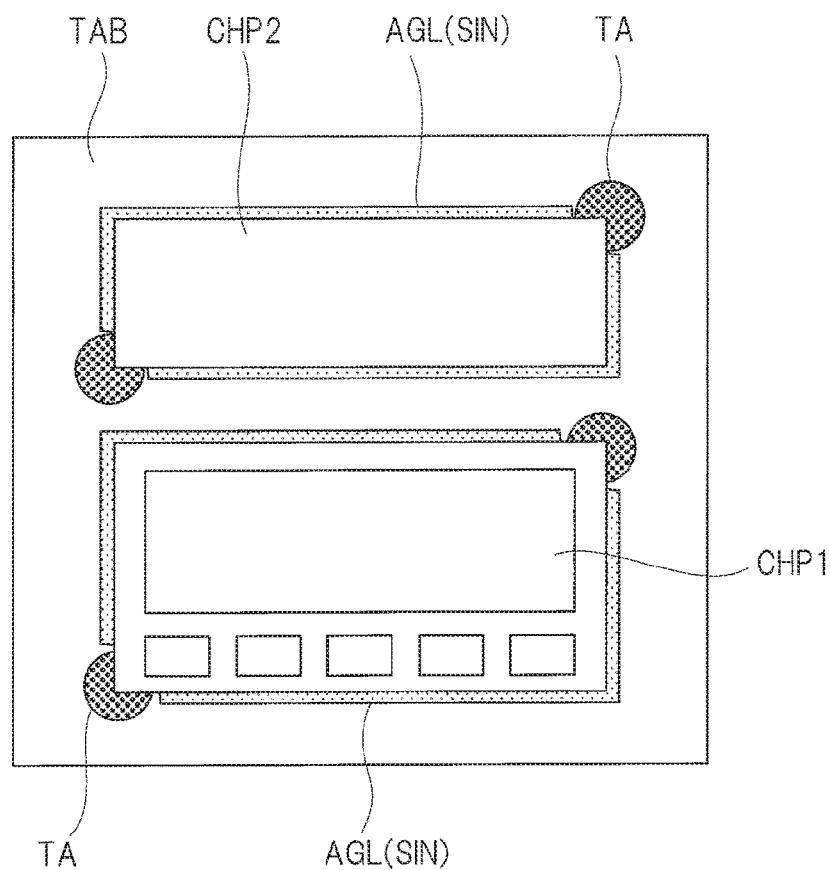
(b)
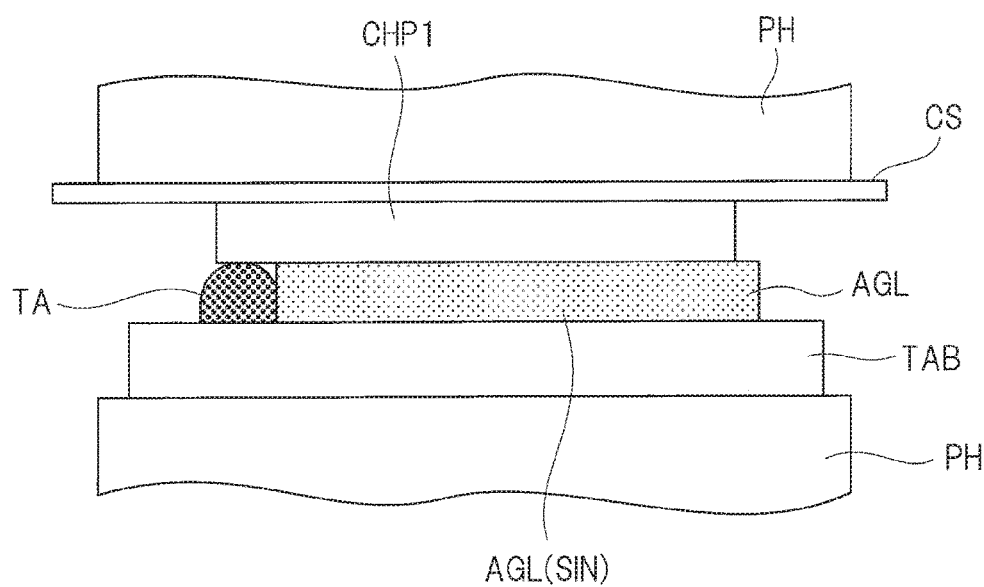

FIG. 14
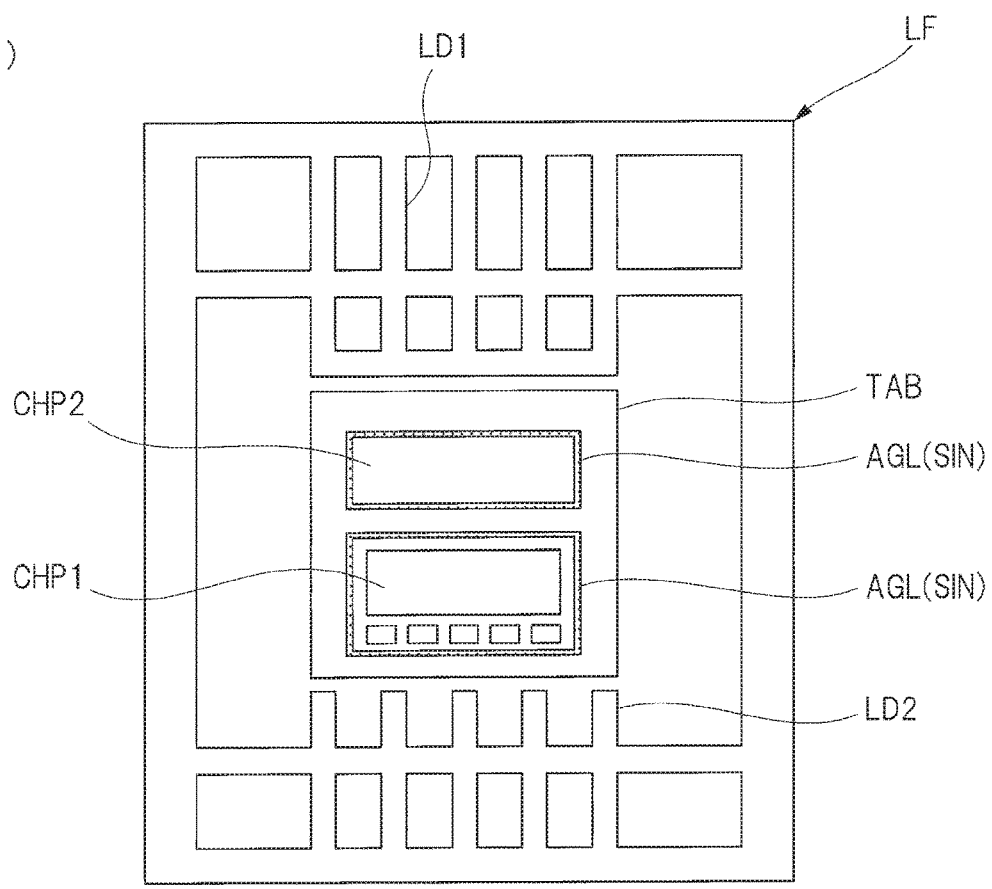
(a)
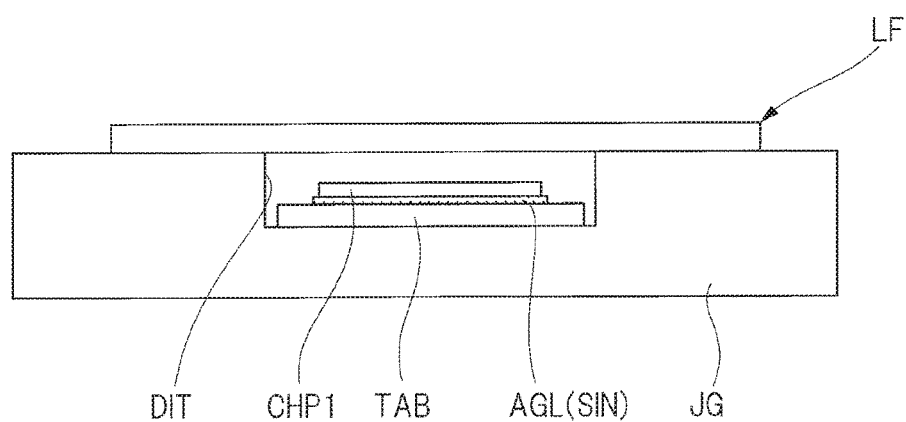
(b)

FIG. 15
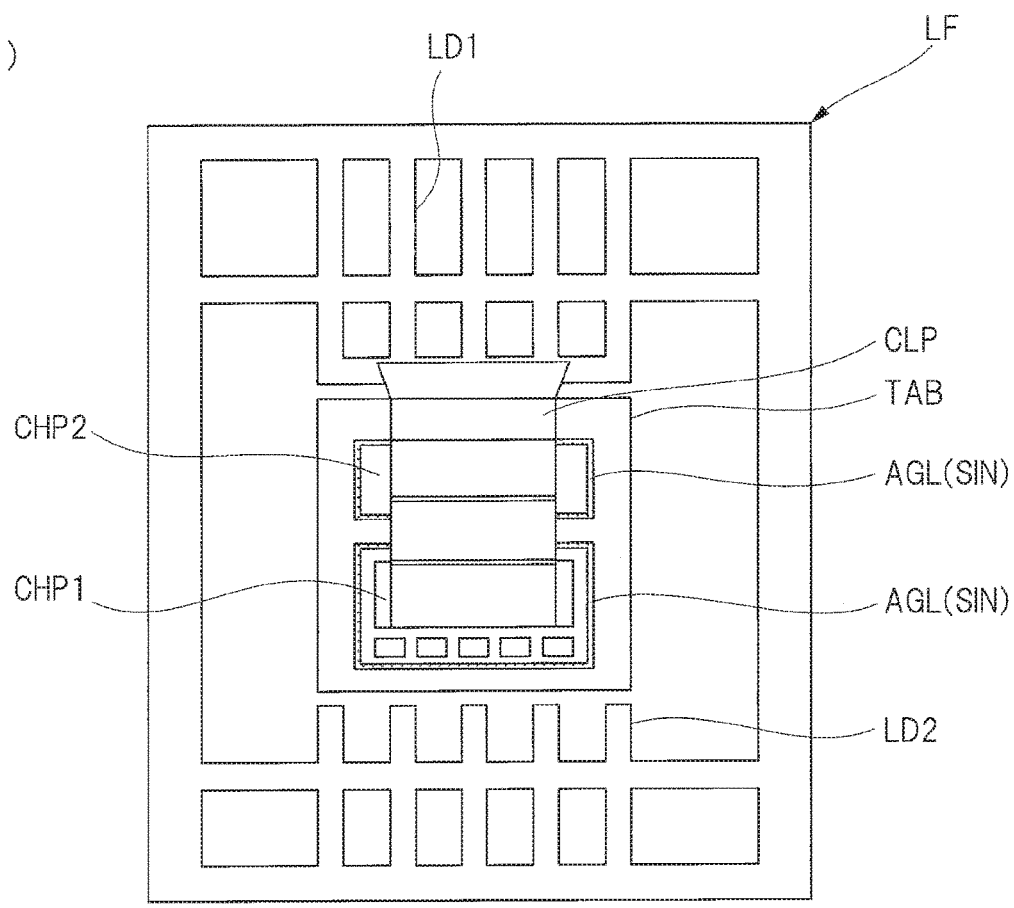
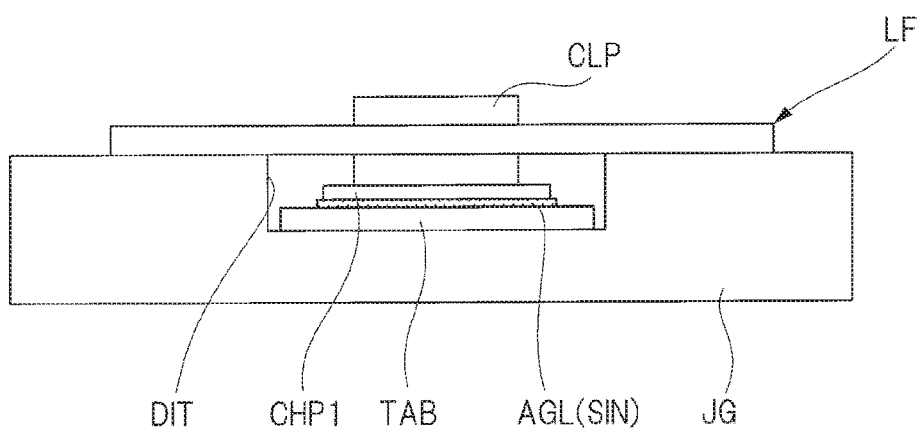

FIG. 16
(a)
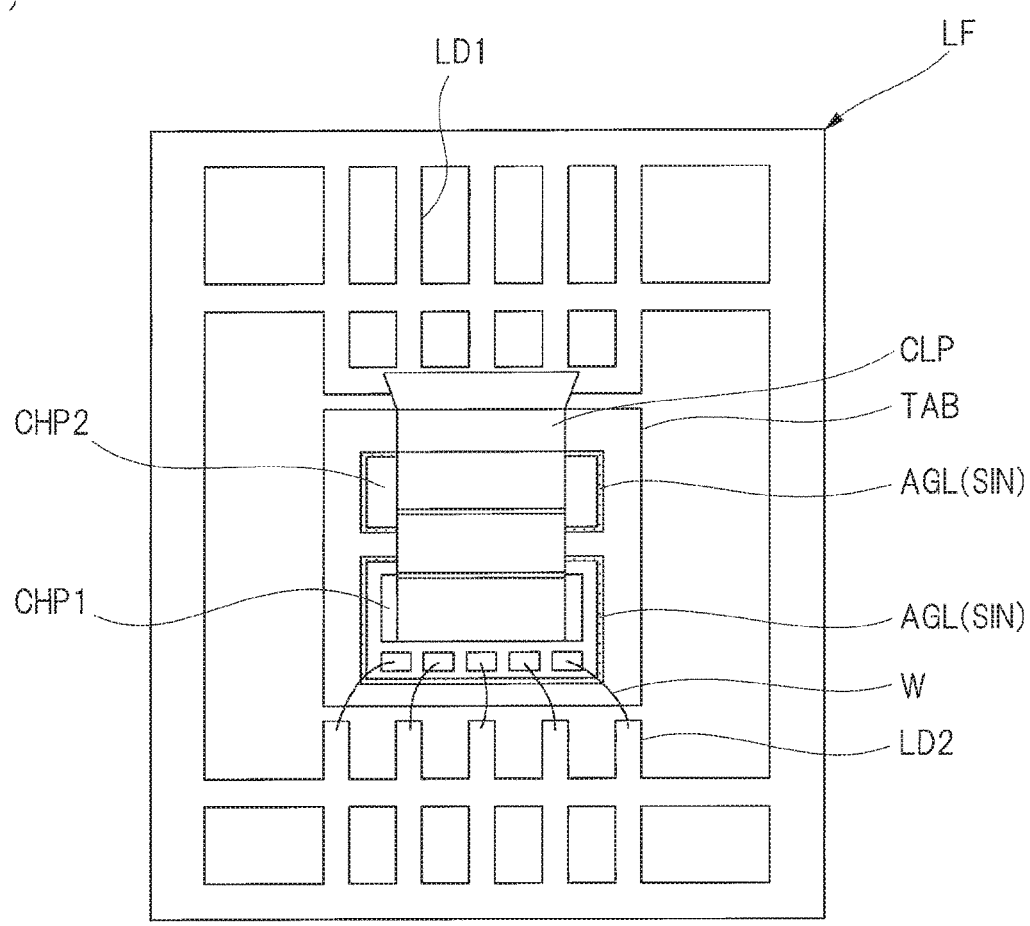
(b)
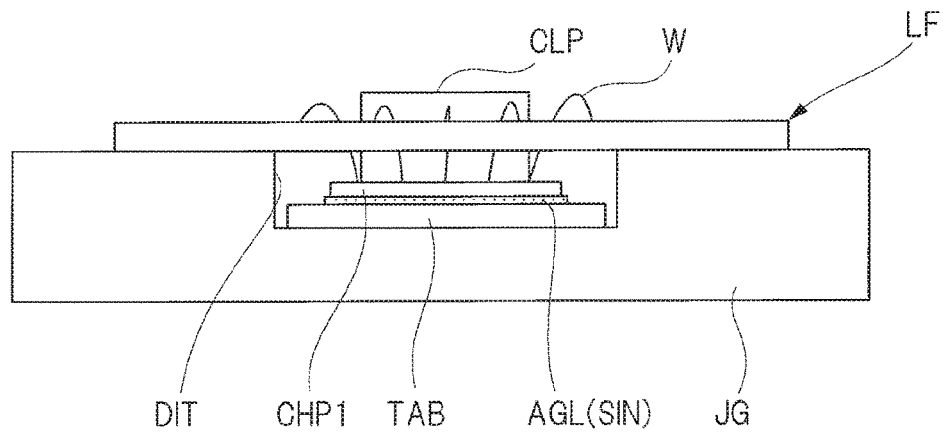

FIG. 17
(a)
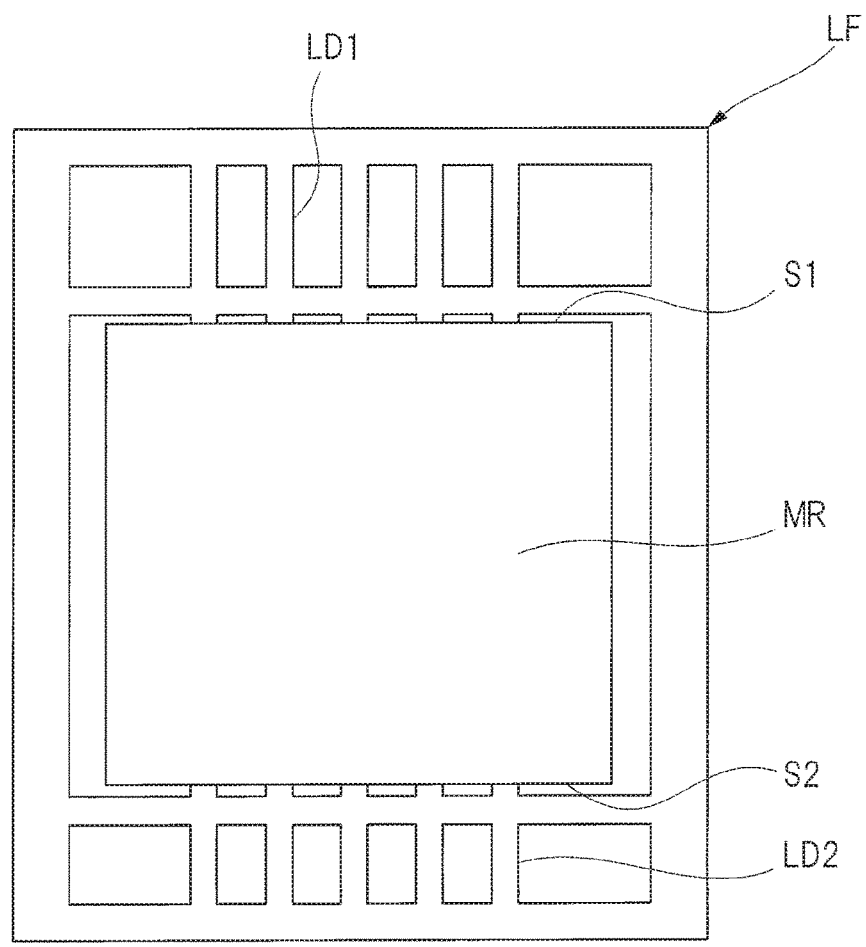
(b)
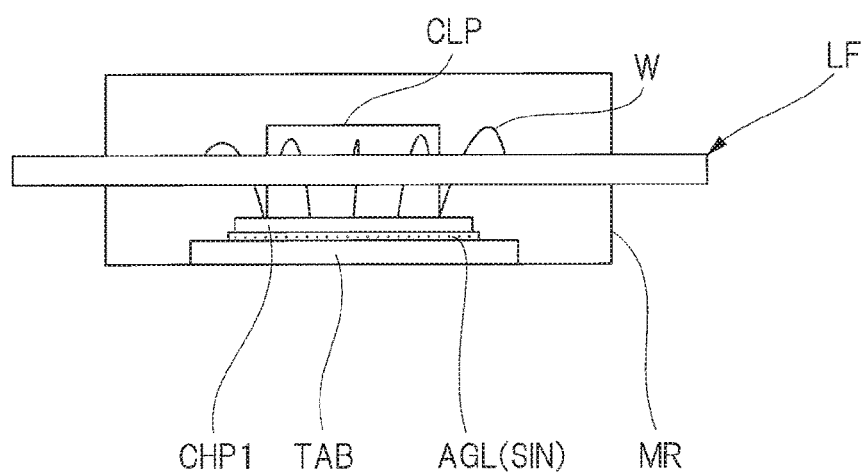

FIG. 18
(a)
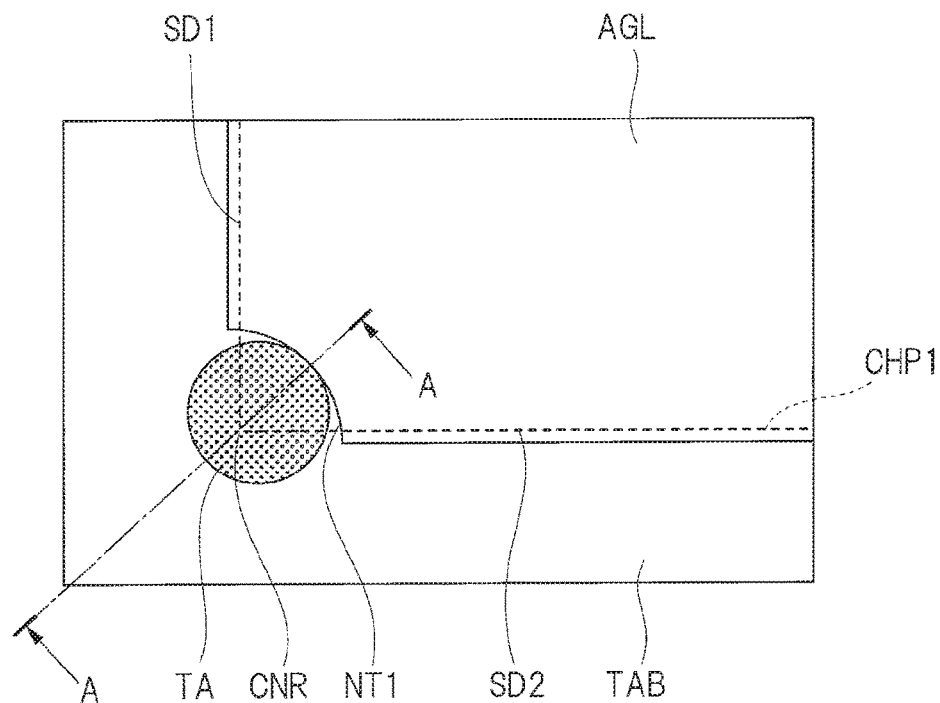
(b)
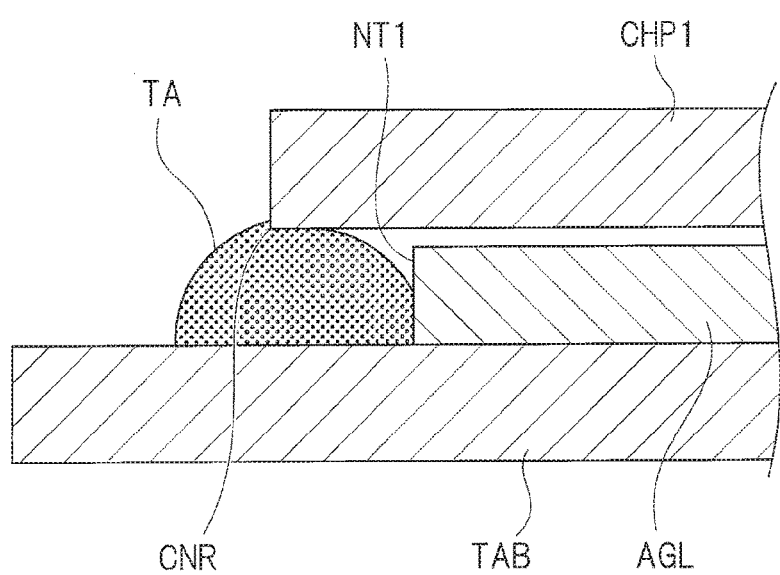

FIG. 20
(a)
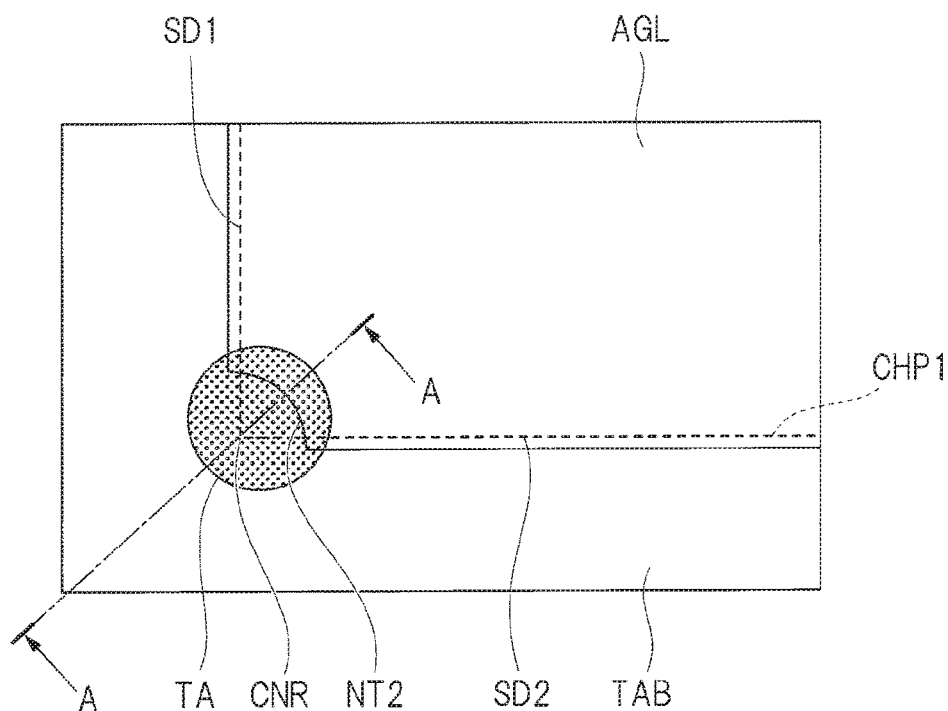
(b)
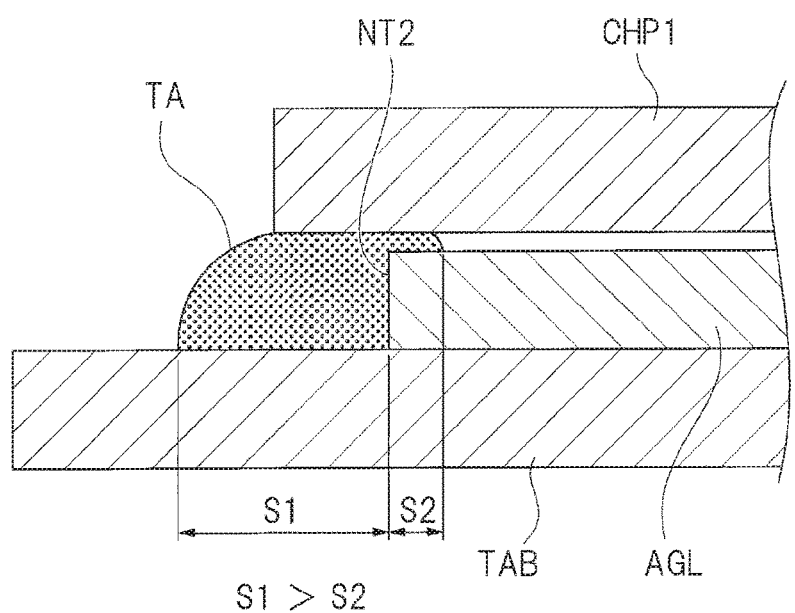
S1 > S2

FIG. 21
(a)
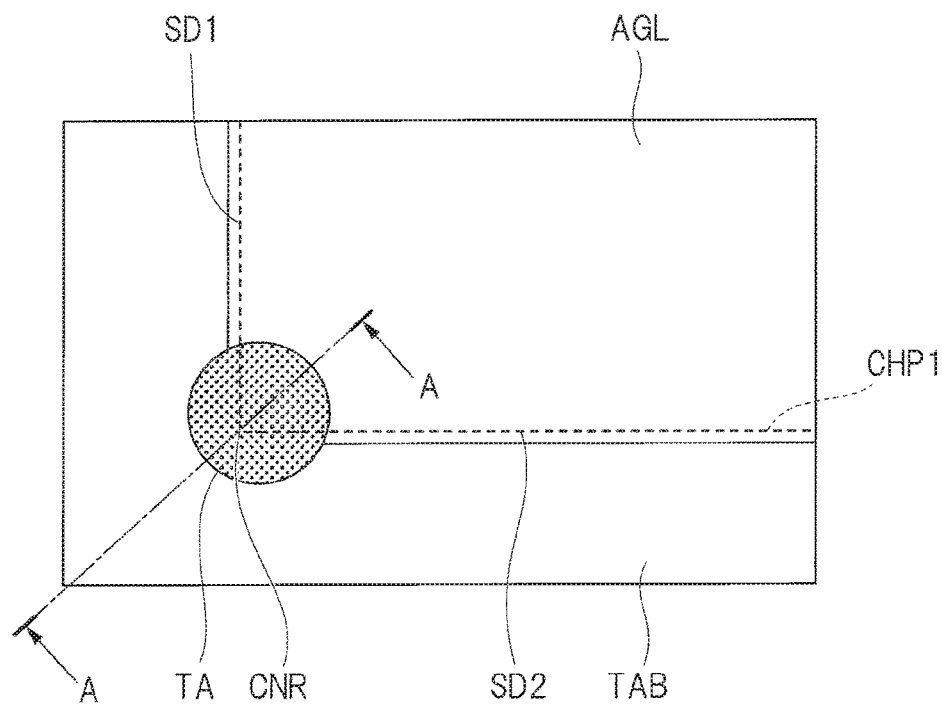
(b)
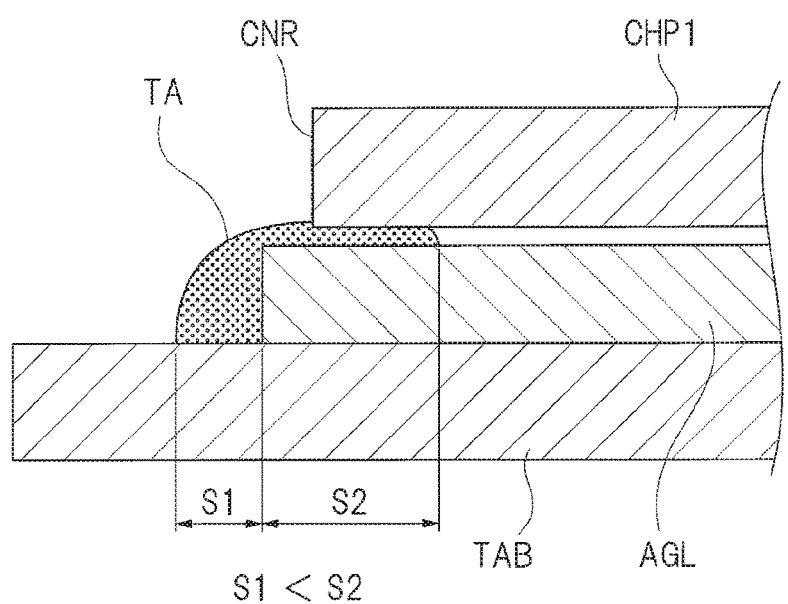

SEMICONDUCTOR DEVICE AND MANUFACTURING METHOD THEREOF

TECHNICAL FIELD

The present invention relates to a semiconductor device and a manufacturing technique thereof and, for example, a technique effectively applied to a semiconductor device and a manufacturing technique thereof, in which a tip mounting part and a semiconductor chip are electrically connected to each other via an Ag layer (silver layer).

BACKGROUND ART

Japanese Patent Application Laid-Open No. 2011-249801 (Patent Document 1) has described a technique for supplying a liquid onto a surface of a sintered layer, and thereby fixing the sintered layer and a power semiconductor element by improving an adhesive force therebetween.

RELATED ART DOCUMENTS

Patent Documents

Patent Document 1: Japanese Patent Application Laid-open No. 2011-249801

SUMMARY OF THE INVENTION

Problems to be Solved by the Invention

Conventionally, as a material for connecting a chip mounting part and a semiconductor chip with each other, a so-called high-melting point soldering material that contains lead and has a melting point of about 300° C. has been used. However, from consideration of the environment, conversion to a lead-free material containing no lead has advanced. In this trend, silver (Ag) materials having low electric resistivity have attracted the public attention, and a technique for electrically connecting the tip mounting part and the semiconductor chip by an Ag layer has been utilized. Here, as the Ag layer for connecting the chip mounting part and the semiconductor chip, an Ag layer having a configuration in which silver particles are bound to one another via an epoxy resin or the like is generally used. In recent years, however, an Ag layer having a configuration (so-called sintered silver) which contains hardly any epoxy resin or the like, and forms metallic bonds with mutual silver particles by applying heat and pressure thereto has attracted the general attention. This Ag layer having the sintered structure has advantages of being able to lower electric resistivity of the Ag layer and to make heat conductivity high.

The Ag layer described in the present specification is premised on an Ag layer having a sintered structure that forms metallic bonds with mutual silver particles by applying heat and pressure thereto. This Ag layer having the sintered structure is formed by processes described below. That is, for example, a paste whose solvent contains silver particles is supplied (printed) onto a chip mounting part and is heated; thereafter the solvent is volatilized from the paste; and the paste is dried. Thus, after the formation of the Ag layer, a semiconductor chip is mounted on this Ag layer; heat and pressure are applied to the Ag layer through the semiconductor chip; and the Ag layer having the sintered structure in which metallic bonds with mutual silver particles are formed is formed.

Here, steps of applying a heating process thereto, volatilizing the solvent from the paste, and drying the paste are carried out in order to suppress occurrence of voids between the semiconductor chip and the Ag layer by the volatilization of the solvent remaining on the Ag layer after the semiconductor chip has been mounted on the Ag layer. However, since a solvent component is volatilized from the paste in the drying step, the dried Ag layer becomes a porous state, so that tackiness (adhesiveness) possessed by the paste is also lost. When the semiconductor chip is mounted on the Ag layer in this state, the semiconductor chip cannot be positively fixed thereon since no tackiness is exerted by the Ag layer. Therefore, a positional deviation of the semiconductor chip tends to easily occur. When such a positional deviation occurs, great pressure is locally applied to the semiconductor chip in the step of applying heat and pressure to the Ag layer through the semiconductor chip, and thereby the inventors of the present invention have newly found that possibility of occurrence of cracks in the semiconductor chip becomes strong. That is, according to the examinations by the present inventors, when the Ag layer having the sintered structure is adopted for electrical connection between the chip mounting part and the semiconductor chip, there is some room for improvements from the viewpoint of enhancing reliability of the semiconductor device.

The other problems and novel features will be apparent from the description and the attached drawings of the present specification.

Means for Solving the Problems

A manufacturing method of a semiconductor device according to one embodiment has a step of mounting a semiconductor chip on onto a first Ag layer on a chip mounting part. Moreover, in this step, after supplying a first material so as to come in contact with the chip mounting part, the semiconductor chip is mounted on the first Ag layer so that one portion of the rear surface of the semiconductor chip comes in contact with the first material.

Effects of the Invention

According to one embodiment, it becomes possible to improve reliability of the semiconductor device.

BRIEF DESCRIPTIONS OF THE DRAWINGS

FIG. 1(a) to FIG. 1(e) are views each of which schematically shows one portion of manufacturing steps of a semiconductor device for realizing electrical connection between a chip mounting part and a semiconductor chip by using an Ag layer having a sintered structure in related techniques;

FIG. 2(a) and FIG. 2(b) are views explaining some room for improvements in a technique of using a temporarily fixing material;

FIG. 3(a) and FIG. 3(b) are views for use in explaining some room for improvements in the technique of using the temporarily fixing material;

FIG. 4(a) is an upper surface view showing an appearance configuration of a semiconductor device according to one embodiment, FIG. 4(b) is a side face view, and FIG. 4(c) is a lower surface view;

FIG. 5(a) to FIG. 5(c) are views that show an internal structure of a sealing body of the semiconductor device according to the embodiment, and FIG. 5(a) is a plan view, FIG. 5(b) is a cross-sectional view taken along line A-A of FIG. 5(a) and FIG. 5(c) is a cross-sectional view taken along line B-B of FIG. 5(a);

Figure 19:
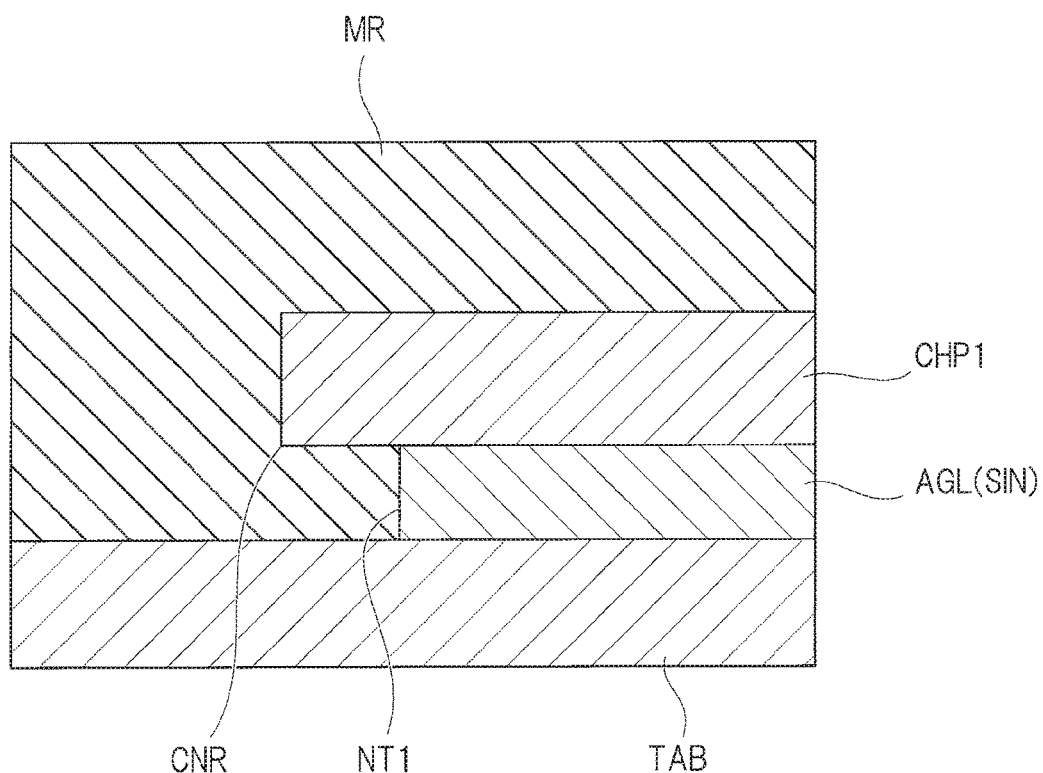

FIG. 9(a) and FIG. 9(b) are views showing a manufacturing step of the semiconductor device according to the embodiment, FIG. 9(a) is a plan view and FIG. 9(b) is a cross-sectional view;

FIG. 10(a) and FIG. 10(b) are views showing a manufacturing step of the semiconductor device that follows FIG. 9, FIG. 10(a) is a plan view and FIG. 10(b) is a cross-sectional view;

FIG. 11(a) and FIG. 11(b) are views showing a manufacturing step of the semiconductor device that follows FIG. 10, FIG. 11(a) is a plan view and FIG. 11(b) is a cross-sectional view;

FIG. 12(a) and FIG. 12(b) are views showing a manufacturing step of the semiconductor device that follows FIG. 11, FIG. 12(a) is a plan view and FIG. 12(b) is a cross-sectional view;

FIG. 13(a) and FIG. 13(b) are views showing a manufacturing step of the semiconductor device that follows FIG. 12, FIG. 13(a) is a plan view and FIG. 13(b) is a cross-sectional view;

FIG. 14(a) and FIG. 14(b) are views showing a manufacturing step of the semiconductor device that follows FIG. 13, FIG. 14(a) is a plan view and FIG. 14(b) is a cross-sectional view;

FIG. 15(a) and FIG. 15(b) are views showing a manufacturing step of the semiconductor device that follows FIG. 14, FIG. 15(a) is a plan view and FIG. 15(b) is a cross-sectional view;

FIG. 16(a) and FIG. 16(b) are views showing a manufacturing step of the semiconductor device that follows FIG. 15, FIG. 16(a) is a plan view and FIG. 16(b) is a cross-sectional view;

FIG. 17(a) and FIG. 17(b) are views showing a manufacturing step of the semiconductor device that follows FIG. 16, FIG. 17(a) is a plan view and FIG. 17(b) is a cross-sectional view;

FIG. 18(a) is an enlarged plan view schematically showing a state in which a semiconductor chip is fixed by a temporarily fixing material formed on the chip mounting part, and FIG. 18(b) is a cross-sectional view taken along line A-A of FIG. 18(a);

FIG. 19 is a cross-sectional view schematically showing a state after a molding step;

FIG. 20(a) is an enlarged plan view schematically showing a state in which a semiconductor chip is fixed by a temporarily fixing material formed on a chip mounting part in a modified example 1, and FIG. 20(b) is a cross-sectional view taken along line A-A of FIG. 20(a); and FIG. 21(a) is an enlarged plan view schematically showing a state in which a semiconductor chip is fixed by a temporarily fixing material formed on a chip mounting part in a modified example 2, and FIG. 21(b) is a cross-sectional view taken along line A-A of FIG. 21(a).

DETAILED DESCRIPTION OF PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

In addition, components having the same function are denoted by the same reference characters throughout the drawings for describing the embodiments, and the repetitive description thereof will be omitted. Incidentally, in the drawings used in the following embodiments, hatching is used even in a plan view so as to make the drawings easy to see.

<Definition of Ag Layer Having Sintered Structure>

First, described below will be definition of an Ag layer having a sintered structure as premise of the present specification. The Ag layer having the sintered structure, which is premised in the present specification, is different from an Ag layer containing an epoxy resin as a binder. That is, both of the Ag layer having a structure, in which the epoxy resin is interposed, and the Ag layer having the sintered structure are provided in paste states. However, a paste for forming the Ag layer having the structure in which the epoxy resin is interposed has about 0.7 regarding a volume ratio of a resin component to silver (1). In contrast, a paste for forming the Ag layer having the sintered structure, which is targeted in the present specification, has about 0.3 regarding the volume ratio of the resin component to silver (1). Further, after solidification of the paste, the Ag layer having the structure in which the epoxy resin is interposed has about 0.5 regarding the volume ratio of the resin component to silver (1). In contrast, after the solidification of the paste, the Ag layer having the sintered structure contains hardly any resin component. In this manner, the Ag layer having the sintered structure, which is targeted in the present specification, is defined.

<Examination for Improvements>

Next, on the premise that the Ag layer having the sintered structure is adopted to electrical connection between a chip mounting part and a semiconductor chip, the inventors of the present invention have examined improvements of a semiconductor device from the viewpoint of enhancing its reliability, and have found that room for improvements is present. Therefore, in the following description, this room for improvements will be explained, and thereafter, technical ideas of the present embodiments devised based on the room for improvements will be explained.

FIG. 1(a) to FIG. 1(e) are views each of which schematically shows one portion of manufacturing steps of a semiconductor device for realizing an electrical connection between a chip mounting part and a semiconductor chip by using the Ag layer having the sintered structure in related techniques. Incidentally, the "related techniques" referred to in the present specification are techniques having problems newly found by the inventors. Moreover, the "related techniques" referred to in the present specification are techniques described by intending not well-known conventional techniques but premised techniques (unknown techniques) of novel technical ideas.

Figure 1:
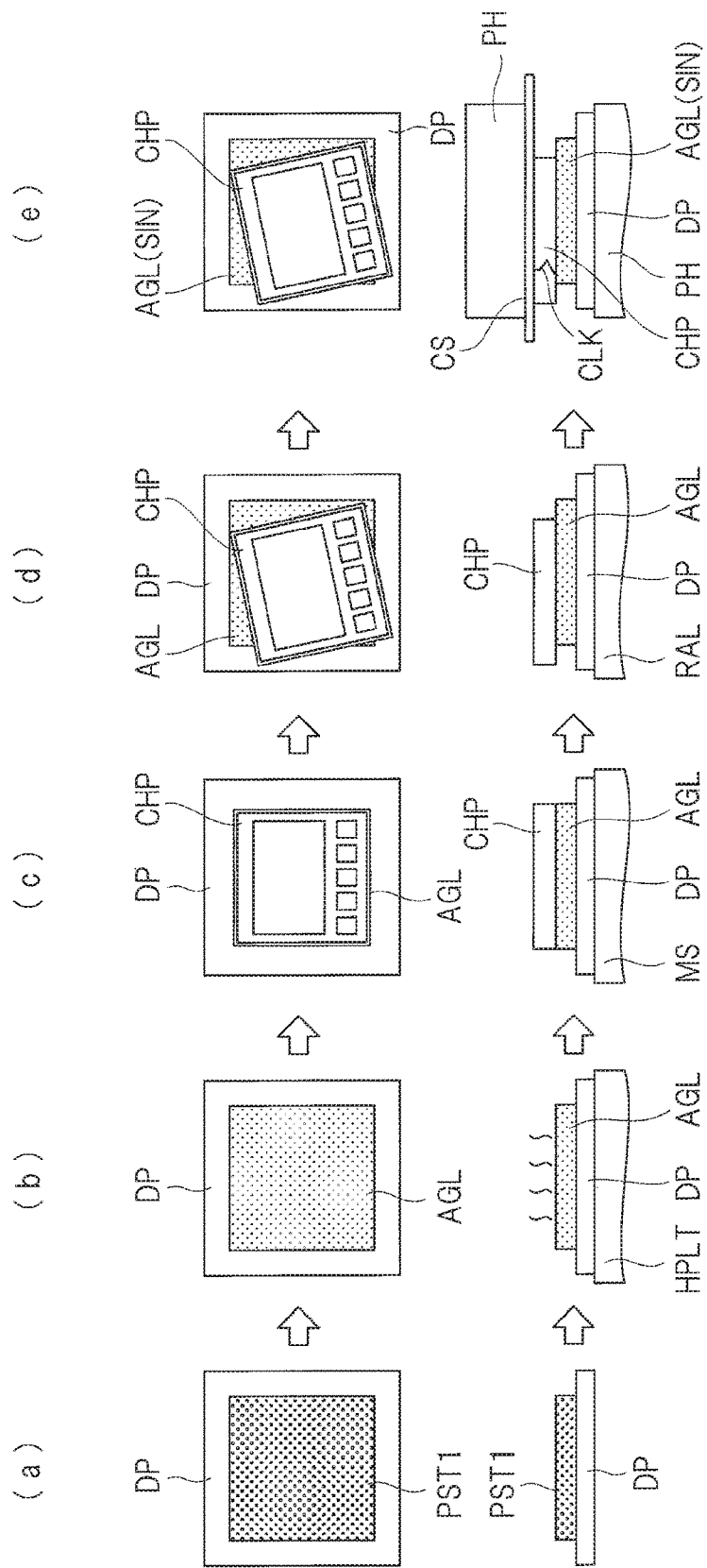

First, as shown in FIG. 1(a), a paste PST1 containing silver particles and a solvent is applied onto a die pad (chip mounting part) DP by using, for example, a printing method. Thereafter, as shown in FIG. 1(b), by disposing and heating the die pad DP on a heat plate HPLT, the solvent contained in the paste PST1 applied onto the die pad DP is volatilized, and the paste PST1 is dried. Thus, on the die pad DP, an Ag layer AGL in a porous state is formed.

Next, as shown in FIG. 1(c), after the die pad DP has been moved from on the heat plate HPLT onto a mount stage MS, a semiconductor chip CHP is mounted on the Ag layer AGL. Then, in a state where the semiconductor chip CHP is mounted on the Ag layer AGL, the die pad DP is moved from the mount stage MS onto a transport rail RAL. At this time, for example, vibration is sometimes applied onto the die pad DP, and the Ag layer AGL located on a lower layer of the semiconductor chip CHP is in the porous state and has no tackiness (adhesiveness). Therefore, as shown in FIG. 1(d), the semiconductor chip CHP tends to cause a positional deviation by a slight disturbance. In this case, as shown in FIG. 1(e), while the semiconductor chip CHP is deviated from its original mounting position, a heating process and a pressurizing process by a press head PH are performed to the die pad PD on which the semiconductor chip CHP is mounted, a buffer member CS being interposed between the press head and the semiconductor chip. Thus, the pressure is applied onto the Ag layer AGL, and the Ag layer AGL (SiN) having the sintered structure is formed. Together with this, as shown in FIG. 1(e), a force is locally applied to the semiconductor chip CHP causing the positional deviation, and so there is a fear of cracks occurring in the semiconductor chip CHP. For this reason, there is room for improvements in the related techniques from the viewpoint of enhancing the reliability of the semiconductor device.

Here, as techniques for eliminating the above-mentioned room for improvements, the following techniques can be proposed. For example, as shown in FIG. 2(a), it is proposed to supply a temporarily fixing material TA, which is made of a liquid, to a surface of the Ag layer AGL dried and made the porous state. In this case, the temporarily fixing material TA made of the liquid has tackiness. Therefore, when the semiconductor chip is mounted on the Ag layer AGL onto which the temporarily fixing material TA has been supplied, the semiconductor chip is fixed by the tackiness possessed by the temporarily fixing material TA. As a result, the positional deviation of the semiconductor chip is considered to be suppressed.

Figure 3:
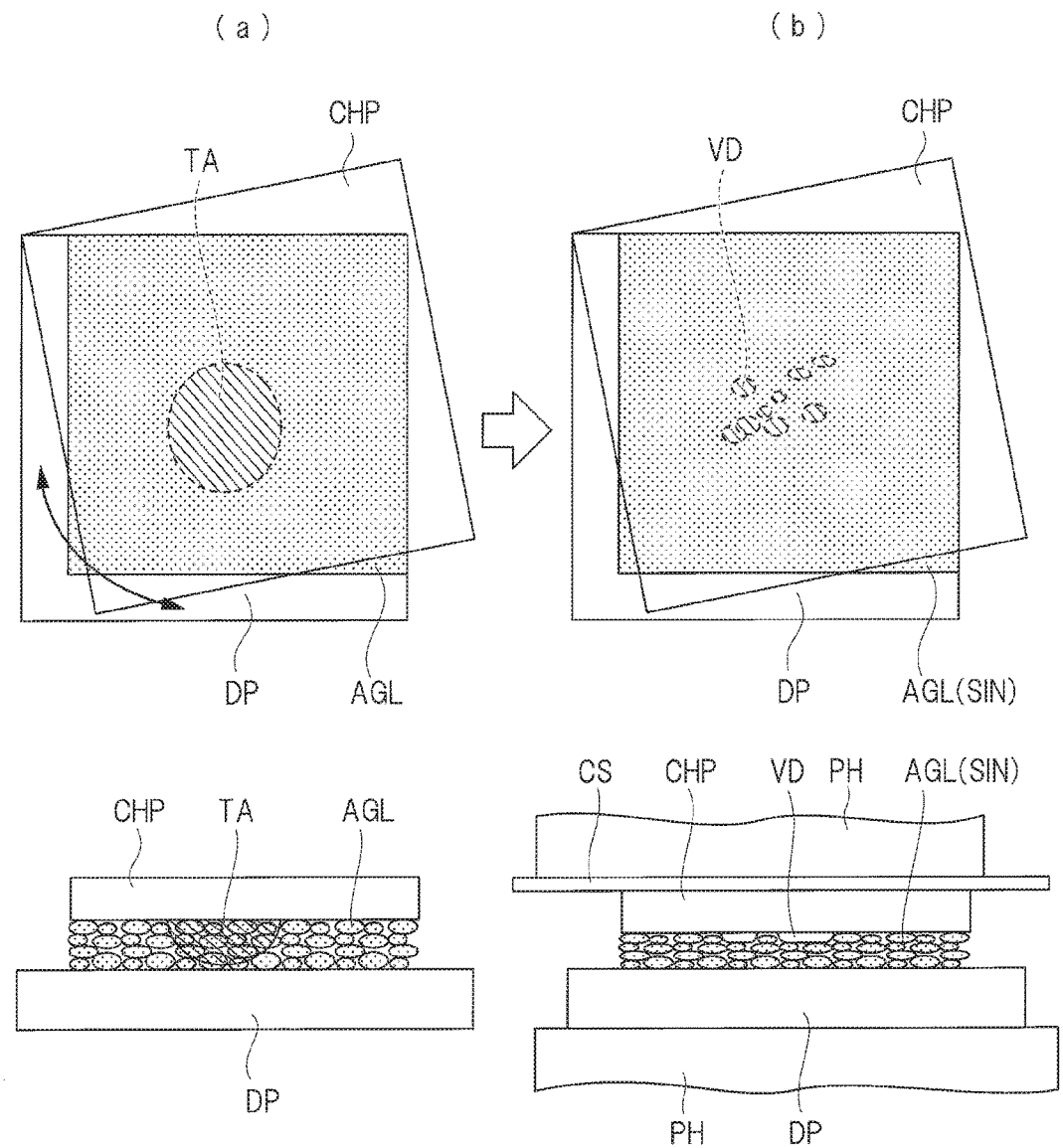

However, as shown in FIG. 2(b), since the Ag layer AGL becomes the porous state, the temporarily fixing material TA supplied onto the Ag layer AGL is easy to permeate into the porous Ag layer AGL. This means that a change in an amount of the residual temporarily fixing material TA on the surface of the Ag layer AGL occurs. That is, in this technique, as shown in FIG. 3(a), the amount of the temporarily fixing material TA making a contribution for holding a position of the semiconductor chip CHP becomes unstable, and thereby even when the temporarily fixing material TA is supplied onto the Ag layer AGL, it is not possible to effectively suppress the positional deviation of the semiconductor chip CHP. Moreover, as shown in FIG. 3(b), even in the case when the heating process and the pressurizing process are carried out onto the Ag layer AGL by using the press head PH, the temporarily fixing material TA permeated into the Ag layer AGL is volatilized. But, no leak path for the volatilized solvent is formed, and the volatilized solvent is trapped in a lower layer of the semiconductor chip CHP, so that voids VD are generated in the Ag layer AGL (SIN) on the lower layer of the semiconductor chip CHP. As a result, by the voids, there are fears of separation occurring between the semiconductor chip CHP and the Ag layer AGL (SIN), and cracks occurring in the semiconductor chip CHP.

As described above, the above-mentioned technique not only fails to effectively suppress the positional deviation of the semiconductor chip CHP but also brings occurrence of the voids between the semiconductor chip CHP and the Ag layer AGL (SIN), so that the technique is considered to be unable to improve the reliability of the semiconductor device.

Therefore, the present embodiment is devised from the viewpoint of preventing the positional deviation of the semiconductor chip CHP, and a technical idea about the devised present embodiment will be described below with reference to the drawings.

<Mounting Configuration of Semiconductor Device According to Embodiment>

The semiconductor device according to the present embodiment relates to, for example, an inverter circuit, and one insulating gate bipolar transistor (hereinafter, referred to as "IGBT") serving as one constituent element of the inverter circuit, and one diode are formed as one package. That is, for example, by using six semiconductor devices according to the present embodiment, an electronic device (power module) to be a three-phase inverter circuit for driving a three-phase motor is constituted.

Figure 4:
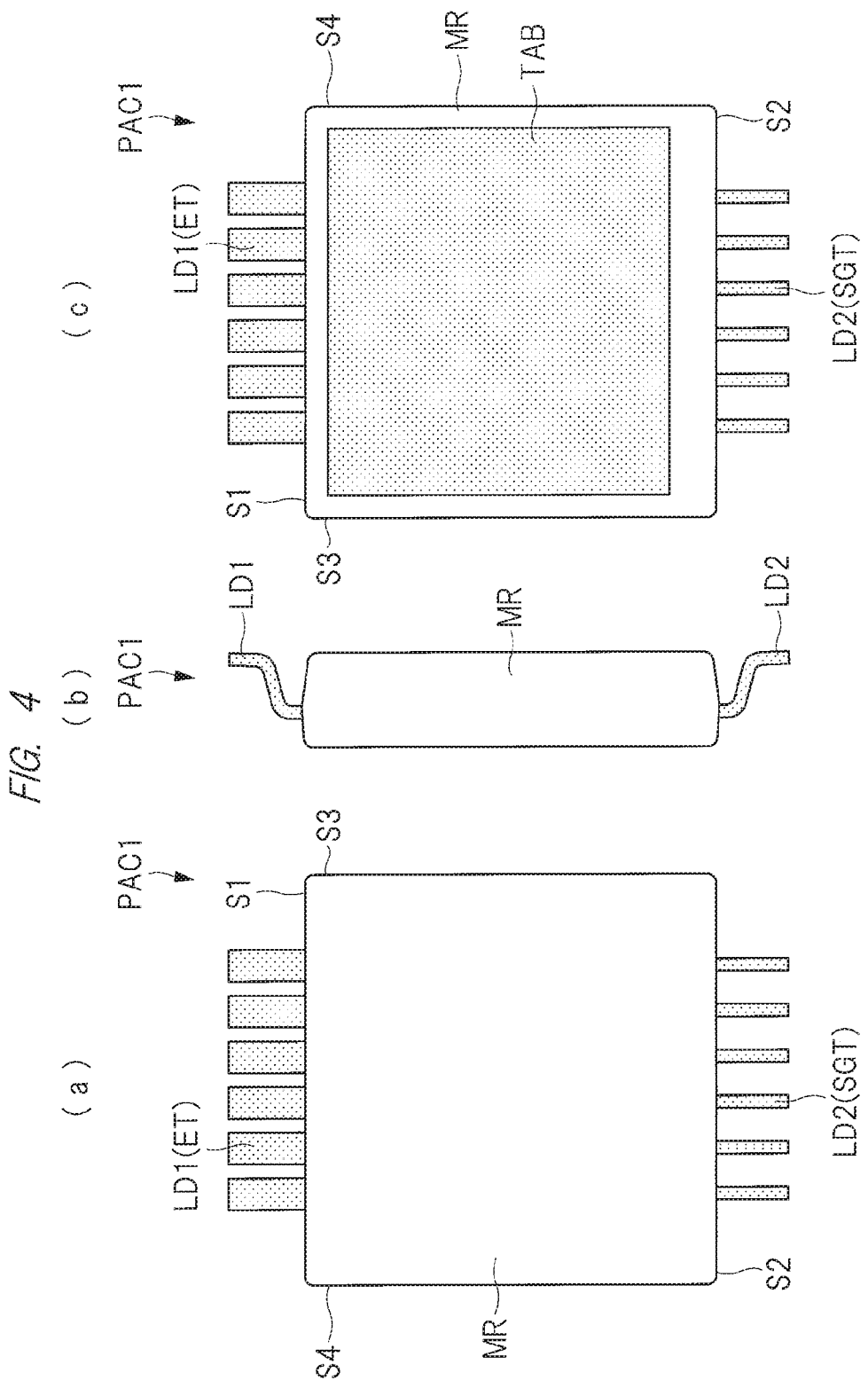

FIG. 4(a) to FIG. 4(c) are views showing an appearance configuration of a semiconductor device PAC1 according to the present embodiment. More specifically, FIG. 4(a) is an upper surface view showing the appearance configuration of the semiconductor device PAC1 according to the present embodiment, FIG. 4(b) is a side face view and FIG. 4(c) is a lower surface view.

As shown in FIG. 4(a), the semiconductor device PAC1 of the present embodiment has a rectangular sealing body MR made of a resin. This sealing body MR has: an upper surface shown in FIG. 4(a); a lower surface (FIG. 4(c)) opposite to the upper surface; a first side face located between the upper surface and the lower surface in its thickness direction; and a second side face opposing the first side face. In FIG. 4(a), a side S1 forming the first side face is illustrated, and a side S2 forming the second side face is illustrated. Moreover, the sealing body MR has: a third side face that intersects with the first side face and the second side face; and a fourth side face that intersects with the first side face and the second side face and opposes the third side face. In FIG. 4(a), a side S3 forming the third side face is illustrated, and a side S4 forming the fourth side face is illustrated.

Here, in the semiconductor device PAC1 of the present embodiment, as shown in FIG. 4(a), one portion of each of a plurality of leads LD1 protrudes from the first side face, and one portion of each of a plurality of leads LD2 protrudes from the second side face. At this time, the leads LD1 form emitter terminals ET, and the leads LD2 form signal terminals SGT. Moreover, a width of each of the plurality of leads LD1 forming the emitter terminals ET becomes wider than a width of each of the plurality of leads LD2 forming the signal terminals SGT. In other word, in the present embodiment, when the plurality of leads LD1 are collectively referred to as "first lead" (first lead group) and the plurality of leads LD2 are collectively referred to as "second lead" (second lead group), a portion of the first lead exposed from the sealing body MR are constituted by a plurality of portions (plurality of leads LD1), and a portion of the second lead exposed from the sealing body MR are constituted by a plurality of portions (plurality of leads LD2). At this time, in a plan view, each width of the plurality of portions of the first lead LD1 can be said to be wider than each width of the plurality of portions of the second lead LD2. This takes into consideration: a large current flows through the emitter terminal ET, and so its resistance needs to be reduced as much as possible, while only a fine current flows through the signal terminal SGT.

Successively, as shown in FIG. 4(b), in the semiconductor device PAC1 of the present embodiment, the leads LD1 and the leads LD2 protruding from the sealing body MR are processed to be bent into a gull wing shape. Thus, it becomes possible to improve packaging easiness of the semiconductor device PAC1. Moreover, as shown in FIG. 4(c), in the semiconductor device PAC1 of the present embodiment, a lower surface (rear surface) of the chip mounting part TAB is exposed from a lower surface (rear surface) of the sealing body MR. Thus, heat radiating efficiency of the semiconductor device can be improved.

Figure 5:
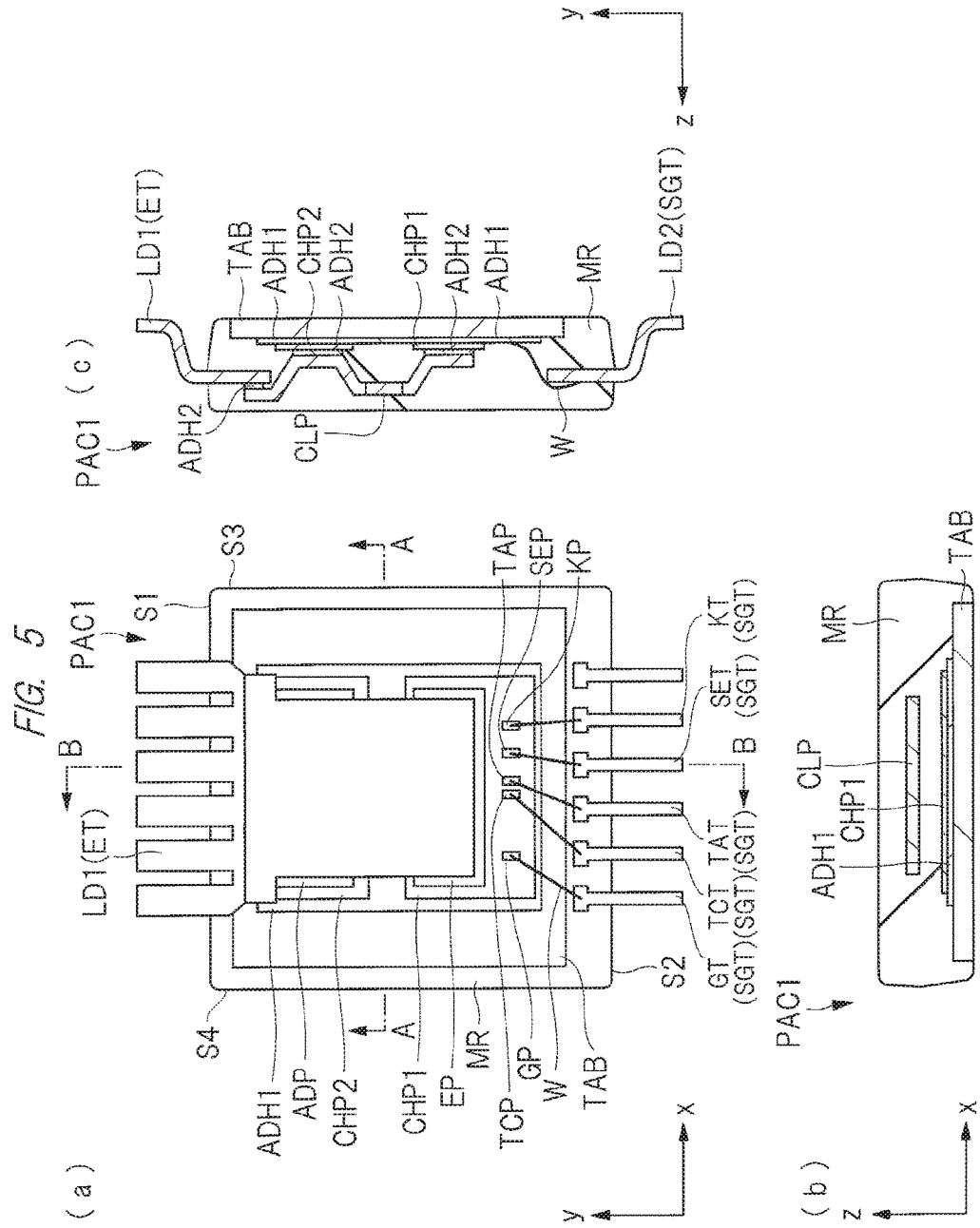

Next, described will be an internal structure of the sealing body MR constituting the semiconductor device PAC1 of the present embodiment. FIG. 5(a) to FIG. 5(c) are views showing the internal structure of the sealing body MR in the semiconductor device PAC1 of the present embodiment. FIG. 5(a) corresponds to a plan view, FIG. 5(b) corresponds to a cross-sectional view taken along line A-A of FIG. 5(a), and FIG. 5(c) corresponds to a cross-sectional view taken along line B-B of FIG. 5(a).

First, in FIG. 5(a), a chip mounting part (die pad) TAB having a rectangular shape is disposed inside the sealing body MR. This chip mounting part TAB also functions as a heat spreader for enhancing the heat radiating efficiency, and is constituted by, for example, a material whose main component is copper having high heat conductivity. Here, the "main component" refers to a material component that contains the largest amount in constituent materials forming a member. For example, the "material whose main component is copper" means that the material of the member contains the largest amount of copper component. An intension of using the term "main component" in the present specification is that, for example, the member is basically made of copper, but a possibility of containing another impurity therein is not eliminated.

A semiconductor chip CHP1 on which the IGBT is formed, and a semiconductor chip CHP2 on which a diode is formed are mounted on the chip mounting part TAB via, for example, a conductive adhesive material ADH1 made of the Ag layer having a sintered structure. At this time, a surface on which the semiconductor chip CHP1 and the semiconductor chip CHP2 are mounted is defined as an upper surface of the chip mounting part TAB, and a surface opposite to this upper surface is defined as a lower surface. In this case, the semiconductor chip CHP1 and the semiconductor chip CHP2 are supposed to be mounted on the upper surface of the chip mounting part TAB. In particular, the semiconductor chip CHP2 on which the diode is formed is disposed so that a cathode electrode pad formed on the rear surface of the semiconductor chip CHP2 comes in contact with the upper surface of the chip mounting part TAB via the conductive adhesive material ADH1. In this case, an anode electrode pad ADP formed on the surface of the semiconductor chip CHP2 is directed upward. On the other hand, the semiconductor chip CHP1 on which the IGBT is formed is disposed so that an collector electrode (collector electrode pad) formed on the rear surface of the semiconductor chip CHP1 comes in contact with the upper surface of the chip mounting part TAB via a conductive adhesive material ADH1. In this case, an emitter electrode pad EP and the plurality of electrode pads formed on the surface of the semiconductor chip CHP1 are directed upward. Therefore, the collector electrode pad of the semiconductor chip CHP1 and the cathode electrode pad of the semiconductor chip CHP2 are electrically connected to each other via the chip mounting part TAB.

Then, as shown in FIG. 5(a), a clip CLP serving as a conductive member is disposed onto the emitter electrode pad EP of the semiconductor chip CHP1 and the anode electrode pad ADP of the semiconductor chip CHP2 via, for example, a conductive adhesive material ADH2 composed of an Ag layer having a sintered structure. This clip CLP is connected to an emitter terminal ET via the conductive adhesive material ADH2. Therefore, the emitter electrode pad EP of the semiconductor chip CHP1 and the anode electrode pad ADP of the semiconductor chip CHP2 are electrically connected to the emitter terminal ET through the clip CLP. That is, in the present embodiment, the clip CLP is electrically connected to the emitter electrode pad EP of the semiconductor chip CHP and the emitter terminal ET (lead LD1) via the Ag layer having the sintered structure formed by a plurality of Ag thin leaves. The clip CLP is constituted by, for example, a plate member mainly composed of copper. That is, in the present embodiment, since a large current flows from the emitter electrode pad EP of the semiconductor chip CHP1 to the emitter terminal ET, the clip CLP that can ensure a large area so as to allow the large current to flow is used.

Moreover, as shown in FIG. 5(a), a plurality of electrode pads are formed on the surface of the semiconductor chip CHP1, and the plurality of electrode pads are electrically connected to signal terminals SGT by wires W serving as conductive members, respectively. More specifically, the plurality of electrode pads include a gate electrode pad GP, a temperature detecting electrode pad TCP, a temperature detecting electrode pad TAP, a current detecting electrode pad SEP, and a Kelvin detecting electrode pad KP. Moreover, the gate electrode pad GP is electrically connected, by the wire W, to a gate terminal GT that is one of the signal terminals SGT. In the same manner, the temperature detecting electrode pad TCP is electrically connected, by the wire W, to a temperature detecting terminal TCT that is one of the signal terminals SGT, and the temperature detecting electrode pad TAP is electrically connected, by the wire W, to a temperature detecting terminal TAT that is one of the signal terminals SGT. Furthermore, the current detecting electrode pad SEP is electrically connected, by the wire W, to a current detecting terminal SET that is one of the signal terminals SGT, and the Kelvin detecting electrode pad KP is electrically connected to a Kelvin terminal KT by the wire W. At this time, the wire W is constituted by a conductive member mainly composed of, for example, gold, copper or aluminum.

Here, as shown in FIG. 5(a), in a plan view, the semiconductor chip CHP2 is mounted on the upper surface of the chip mounting part TAB so as to be positioned between the emitter terminals ET and the semiconductor chip CHP1, and the semiconductor chip CHP1 is also mounted on the upper surface of the chip mounting part TAB so as to be positioned between the semiconductor chip CHP2 and the signal terminals SGT.

In other words, the emitter terminals ET, the semiconductor chip CHP2, the semiconductor chip CHP1, and the signal terminals SGT are disposed along a y-direction as a first direction. More specifically, in a plan view, the semiconductor chip CHP2 is mounted on the upper surface of the chip mounting part TAB so as to be closer to the emitter terminals ET than the semiconductor chip CHP1, and the semiconductor chip CHP1 is consequently mounted on the upper surface of the chip mounting part TAB so as to be closer to the signal terminals SGT than the semiconductor chip CHP2.

Moreover, in a plan view, the semiconductor chip CHP1 is mounted on the upper surface of the chip mounting part TAB so that the gate electrode pad GP is made to be closer to the signal terminals SGT than the emitter electrode pad EP. More specifically, in a plan view, the semiconductor chip CHP1 is mounted on the upper surface of the chip mounting part TAB so that the plurality of electrode pads including the gate electrode pad GP, the temperature detecting electrode pad TCP, the temperature detecting electrode pad TAP, the current detecting electrode pad SEP, and the Kelvin detecting electrode pad KP are made closer to the signal terminals SGT than the emitter electrode pad EP. In other words, in a plan view, it can be said that the plurality of electrode pads of the semiconductor chip CHP1 are disposed along the side closest to the signal terminals SGT among the sides of the semiconductor chip CHP1. At this time, as shown in FIG. 5(a), in a plan view, the clip CLP is disposed so as not to be overlapped with any of the plurality of electrode pads including the gate electrode pad GP and of the plurality of wires W.

In the semiconductor device PAC1 having the internal configuration as described above, the semiconductor chip CH1, the semiconductor chip CHP2, one portion of the chip mounting part TAB, one portion of the emitter terminal ET, one portion of each of the plurality of signal terminals SGT, the clip CLP, and the wires W are sealed with, for example, a resin, so that the sealing body MR is formed.

Successively, in FIG. 5(c), the semiconductor chip CHP1 on which the IGBT is formed, and the semiconductor chip CHP2 on which the diode is formed are mounted on the upper surface of the chip mounting part TAB via the conductive adhesive material ADH1 composed of the Ag layer having the sintered structure. Moreover, the clip CLP is disposed from the surface of the semiconductor chip CHP1 to the surface of the semiconductor chip CHP2 via the conductive adhesive material ADH2 composed of the Ag layer having the sintered structure. The clip CLP is further connected to the emitter terminal ET by the conductive adhesive material ADH2, and one portion of the emitter terminal ET is exposed from the sealing body MR. Furthermore, the semiconductor chip CHP1 is connected to the signal terminals SGT disposed opposite the emitter terminal ET (lead LD1), and one portion of the signal terminals SGT (leads LD2) are also exposed from the sealing body MR.

Here, as shown in FIG. 5(b), the lower surface of the chip mounting part TAB is exposed from the lower surface of the sealing body MR, and this exposed lower surface of the chip mounting part TAB becomes collector terminals. Moreover, when the semiconductor device PAC1 is packaged on a wiring substrate, the lower surface of the chip mounting part TAB becomes a surface capable of being soldered with wirings formed on the wiring substrate.

The semiconductor chip CHP1 and the semiconductor chip CHP2 are mounted on the upper surface of the chip mounting part TAB so that the collector electrode pad of the semiconductor chip CHP1 and the cathode electrode pad of the semiconductor chip CHP2 are in contact with the chip mounting part TAB via the conductive adhesive material ADH1 composed of the Ag layer having the sintered structure. Thus, the collector electrode pads and the cathode electrode pads are electrically connected to each other through the chip mounting part TAB, and consequently are electrically connected to the collector terminals. Moreover, as shown in FIG. 5(c), a thickness of the chip mounting part TAB is made thicker than a thickness of each of the emitter terminal ET and the signal terminals SGT.

In the semiconductor device of the present embodiment, the conductive adhesive material ADH1 and the conductive adhesive material ADH2 are each composed of the Ag layer having the sintered structure. Since the Ag layer having the sintered structure is made of a lead-free material containing no lead in its components, it has an advantage of environmental friendliness. Moreover, the Ag layer having the sintered structure is superior in temperature cycle characteristic and power cycle characteristic, so that an advantage of being able to improve reliability of the semiconductor device PAC1 can be obtained.

Basically, in the semiconductor device PAC1 according to the present embodiment, the conductive adhesive material ADH1 and the conductive adhesive material ADH2 are assumed to have the same material component. However, the present embodiment is not limited to this and, for example, the material forming the conductive adhesive material ADH1 and the material forming the conductive adhesive material ADH2 may be made of different material components. For example, in the present embodiment, the Ag layer having the sintered structure forming the conductive adhesive material ADH1 is subjected to a pressurizing process. On the other hand, the Ag layer having the sintered structure forming the conductive adhesive material ADH1 is not subjected to the pressurizing process.

The semiconductor device in the present embodiment is packaged and configured as described above. That is, the semiconductor device PAC1 of the present embodiment includes: the semiconductor chip CHP1 having a surface on which the emitter electrode pads EP are formed, and a rear surface that is a face opposite to the surface and on which the collector electrodes are formed; and the chip mounting part TAB having an upper surface on which the semiconductor chip CHP1 is mounted, and a lower surface that is a face opposite to the upper surface. Moreover, the semiconductor device PAC1 has the lead LD1 electrically connected to the emitter electrode pads EP of the semiconductor chip CHP1 via the clip CLP, and the sealing body MR for resin-sealing the semiconductor chip CHP1 and the clip CLP. At this time, the collector electrodes of the semiconductor chip CHP1 are electrically connected to the upper surface of the chip mounting part TAB via the Ag layer (conductive adhesive material ADH1) having the sintered structure formed by the plurality of Ag thin leaves.

<Structural Features of Semiconductor Device of Embodiment>

Next, described will be structural features of the semiconductor device according to the present embodiment.

Figure 6:
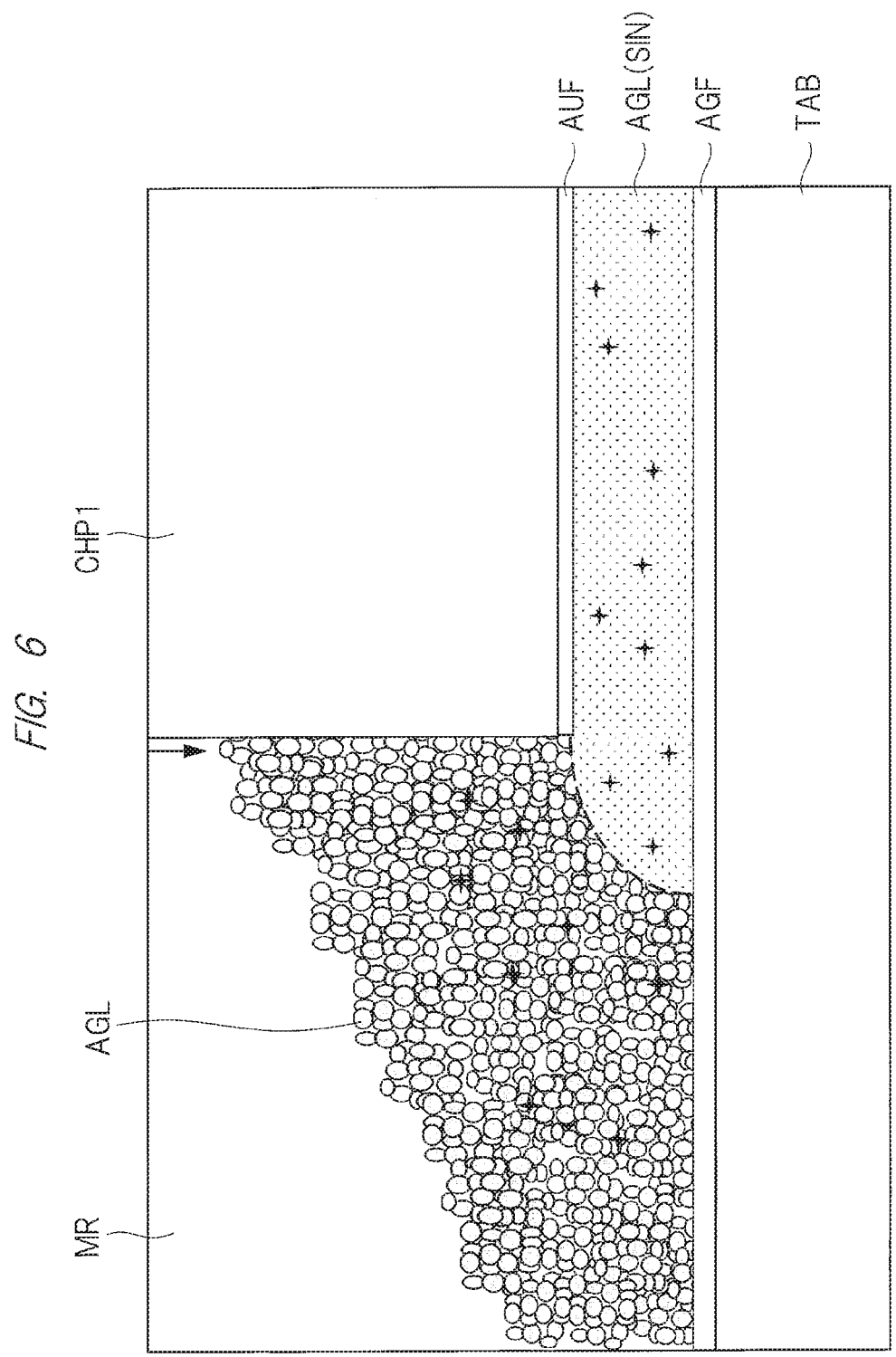
FIG. 6 is a schematic view enlargedly showing a connection structure between the chip mounting part and the semiconductor chip in the semiconductor device according to the embodiment.

FIG. 6 is a schematic view enlargedly showing the connection structure of the chip mounting part TAB and the semiconductor chip CHP1 in the semiconductor device of the present embodiment. In FIG. 6, for example, on the upper surface of the chip mounting part TAB made of a copper material, a silver film AGF is formed by a plating method. On the other hand, a gold film AUF is formed by a plating method on the rear surface of the semiconductor chip CHP1, and an Ag layer AGL (SIN) having a sintered structure is formed between the silver film AGF formed on the upper surface of the chip mounting part TAB and the gold film AUF formed on the rear surface of the semiconductor chip CHP1. Therefore, the silver film AGF formed on the upper surface of the chip mounting part TAB is electrically connected to the Ag layer AGL (SIN) having the sintered structure.

The Ag layer AGL (SIN) having the sintered structure, which is sandwiched between the silver film AGF formed on the upper surface of the chip mounting part TAB and the gold film AUF formed on the rear surface of the semiconductor chip CHP1, is subjected to a heating process and a pressurizing process as will be explained in manufacturing steps described later. Then, as a result of this pressurizing process, as shown in FIG. 6, one portion of the Ag layer AGL (SIN) having the sintered structure is made to stick out from an end portion of the semiconductor chip CHP1. Moreover, in the semiconductor device according to the present embodiment, an Ag layer AGL in a non-pressurized state is formed also outside the semiconductor chip CHP1. That is, since the pressurizing process is carried out via the semiconductor chip CHP1, no pressurizing process is exerted on the Ag layer AGL formed outside the semiconductor chip CHP1, so that the Ag layer AGL becomes the non-pressurized state. Therefore, in the present embodiment, in a plan view seen from the surface of the semiconductor chip CHP1, a density of silver of the Ag layer AGL (SIN) having the pressurized sintered structure formed on a portion overlapping the semiconductor chip CHP1 becomes higher than a density of silver of the Ag layer AGL having the non-pressurized sintered structure formed on another portion that is not overlapped with the semiconductor chip CHP1. On the other hand, a density of the Ag layer AGL (SIN) having the pressurized sintered structure formed on the portion overlapped with the semiconductor chip CHP1 becomes lower than a density of the silver film AGF formed on the upper surface of the chip mounting part TAB. In other words, the density of the silver film AGF formed on the upper surface of the chip mounting part TAB becomes higher than the density of silver of the Ag layer AGL (SIN) having the pressurized sintered structure formed on the portion overlapped with the semiconductor chip CHP1.

Moreover, as shown in FIG. 6, the Ag layer AGL (SIN) having the pressurized sintered structure is formed so as to be sandwiched between the chip mounting part TAB and the semiconductor chip CHP1, and the Ag layer AGL having the non-pressurized sintered structure is formed over from on the upper surface of the chip mounting part TAB to side faces of the semiconductor chip CHP1. For this reason, the Ag layer AGL having the non-pressurized sintered structure has a portion whose thickness is thicker than that of the Ag layer AGL (SIN) having the pressurized sintered structure. Moreover, as shown in FIG. 6, the sealing body MR made of a resin is formed so as to cover the Ag layer AGL having the non-pressurized sintered structure.

As described above, one of the features of the present embodiment lies in that the Ag layer AGL (SIN) having the pressurized sintered structure is formed in a region sandwiched between the chip mounting part TAB and the semiconductor chip CHP1, while the Ag layer AGL having the non-pressurized sintered structure is formed over from on the upper surface of the chip mounting part TAB to an end-portion side face of the semiconductor chip CHP1.

According to the semiconductor device of the present embodiment having the above-mentioned structure, the following advantages can be obtained. In the following description, the advantages of the semiconductor device of the present embodiment will be concretely explained while a semiconductor device of an examination example is compared to the present embodiment.

Figure 7:
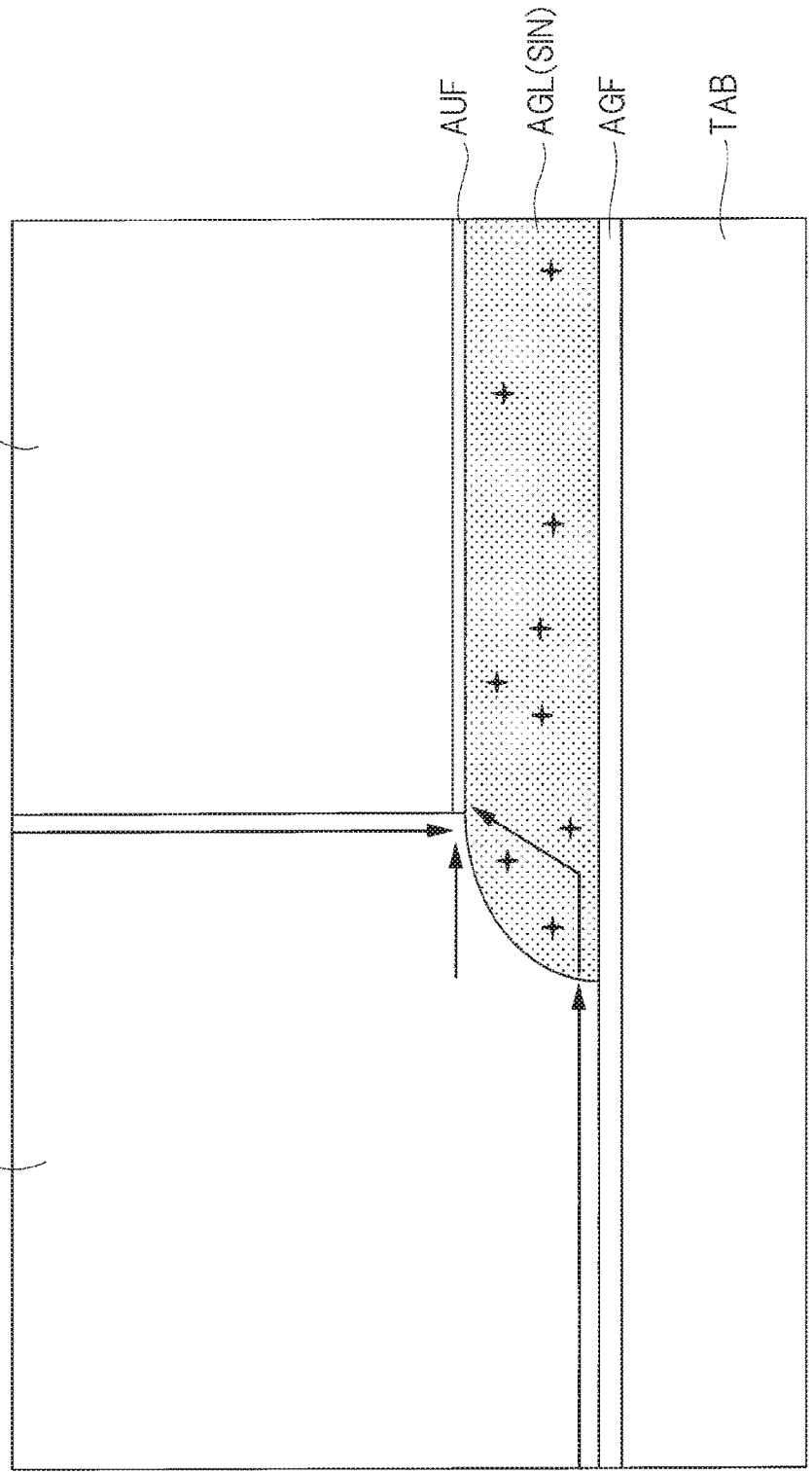
FIG. 7 is a schematic view enlargedly showing a connection structure between a chip mounting part and a semiconductor chip in an examination example.

FIG. 7 is a schematic view enlargedly showing a connection structure of a chip mounting part TAB and a semiconductor chip CHP1 according to an examination example. As understood by referring to FIG. 6 and FIG. 7, a difference between the examination example and the present embodiment lies in that the Ag layer AGL having a non-pressurized sintered structure in the examination example is not formed over from on the upper surface of the chip mounting part TAB to the end-portion side face of the semiconductor chip CHP. That is, in the present embodiment, the Ag layer having the sintered structure is formed so as to have an area larger than a plane area of the semiconductor chip CHP1. As a result, as shown in FIG. 6, the Ag layer AGL (SIN) having the pressurized sintered structure is formed in a region sandwiched between the chip mounting part TAB and the semiconductor chip CHP, and simultaneously the Ag layer AGL having the non-pressurized sintered structure is formed over from on the upper surface of the chip mounting part TAB to the end-portion side face of the semiconductor chip CHP. In contrast, in the examination example, the Ag layer having the sintered structure is formed so as to have an area that is almost the same as the plane area of the semiconductor chip CHP1. As a result, as shown in FIG. 7, the Ag layer AGL (SIN) having the pressurized sintered structure is formed in the region sandwiched between the chip mounting part TAB and the semiconductor chip CHP1. On the other hand, the Ag layer AGL having the non-pressurized sintered structure is not formed over from on the upper surface of the chip mounting part TAB to the end-portion side face of the semiconductor chip CHP.

In the examination example having the above-mentioned structure, there is some room for improvements as described below. That is, in the examination example, the Ag layer having the non-pressurized sintered structure is not formed over from on the upper surface of the chip mounting part TAB to the end-portion side face of the semiconductor chip CHP. Consequently, as shown in FIG. 7, the silver film AGF formed on the upper surface of the chip mounting part TAB and the sealing body MR made of a resin directly come in contact with each other. Here, since adhesiveness between the silver film AGF formed by a plating method and the sealing body MR made of the resin is low, the sealing body MR becomes easily separated from the silver film AGF. That is, as the room for improvements of the examination example, in the examination example, the sealing body MR becomes easily separated from the silver film AGF due to the low adhesiveness between the silver film AGF and the sealing body MR that directly come in contact with each other.

Next, as further room for improvements of the examination example, as shown in FIG. 7, there is concern about the fact that stress from the sealing body MR is concentrated on the end portion of the semiconductor chip CHP1. That is, in the examination example, due to the concentration of the stress onto the end portion of the semiconductor chip CHP1, cracks tend to easily occur in an interface between the rear surface of the semiconductor chip CHP1 and the Ag layer AGL (SIN) having the pressurized sintered structure.

In contrast, in the present embodiment as shown in FIG. 6, the Ag layer AGL having the non-pressurized sintered structure is formed over from on the upper surface of the chip mounting part TAB to the end-portion side face of the semiconductor chip CHP. As a result, concavity and convexity are formed on the surface of the Ag layer AGL having the non-pressurized sintered structure, and an inside thereof is kept in a porous state. Therefore, joining properties between the Ag layer AGL having the non-pressurized sintered structure and the sealing body MR directly made in contact therewith are improved by an anchor effect due to a portion of the sealing body MR entering those concavity and convexity and pores. Moreover, since the Ag layer AGL having the non-pressurized sintered structure is present, contact between the silver film AGF formed on the upper surface of the chip mounting part TAB and the sealing body MR is avoided due to poor adhesiveness therebetween. Thus, according to the present embodiment, interposition of the Ag layer AGL having the non-pressurized sintered structure can effectively suppress the separation of the sealing body MR by a synergistic effect of: the contact between the silver film AGF formed on the upper surface of the chip mounting part TAB and the sealing body MR being avoided due to the poor adhesiveness; and the anchor effect caused by the concavity and convexity and the pores in the surface of the AG layer AGL having the non-pressurized sintered structure being obtained. That is, by the present embodiment, it is possible to eliminate the room for improvements of the examination example.

Moreover, as shown in FIG. 6, in the present embodiment, one portion of the stress from the sealing body MR is absorbed by the Ag layer AGL having the non-pressurized sintered structure. As a result, it is suppressed that the stress from the sealing body MR is concentrated on the end portion of the semiconductor chip CHP1. That is, in the present embodiment, the Ag layer AGL having the non-pressurized sintered structure functions as a cushion member by which the stress from the sealing body MR is relieved. Thus, according to the present embodiment, since the concentration of the stress onto the end portion of the semiconductor chip CHP1 is suppressed, it can be consequently suppressed that the cracks occur in the interface between the rear surface of the semiconductor chip CHP1 and the Ag layer AGL (SIN) having the pressurized sintered structure. Therefore, by the present embodiment, it is possible to also eliminate the further room for improvements of the examination example.

Furthermore, in the present embodiment, it becomes possible to also obtain the following advantages. That is, as can be understood by the fact that the Ag layer having the sintered structure according to the present embodiment is composed of the Ag layer AGL (SIN) having the pressurized sintered structure and the Ag layer AGL having the non-pressurized sintered structure, the Ag layer having the sintered structure according to the present embodiment is formed so as to become larger than the plane size of the semiconductor chip CHP1. This means that the semiconductor chip CHP1 is disposed on the Ag layer having the sintered structure without sticking out from the Ag layer having the sintered structure even if the slight positional deviation occurs at the mounting position of the semiconductor chip CHP1. In other words, according to the present embodiment, the Ag layer having the sintered structure is formed so as to become larger than the plane size of the semiconductor chip CHP1, and so it is possible to increase a margin capable of disposing the semiconductor chip CHP1 on the Ag layer having the sintered structure even if the positional deviation occurs at the mounting position of the semiconductor chip CHP1. As a result, according to the present embodiment, even if the positional deviation occurs at the mounting position of the semiconductor chip CHP1, the semiconductor chip CHP1 and the Ag layer having the sintered structure can be positively connected to each other electrically.

As described above, according to the semiconductor device of the present embodiment, from the viewpoints of not only eliminating the room for improvements existing in the examination example but also positively realizing the electric connection also with respect to the positional deviation of the semiconductor chip CHP1, the reliability of the semiconductor device can be improved.

Moreover, in the present embodiment, the Ag layer AGL (SIN) having the pressurized sintered structure is formed in the region sandwiched between the chip mounting part TAB and the semiconductor chip CHP1, and the Ag layer AGL having the non-pressurized sintered structure is also formed over from on the upper surface of the chip mounting part TAB to the end-portion side face of the semiconductor chip CHP1. This means that the electrical connection between the chip mounting part TAB and the semiconductor chip CHP1 can be made not only by the Ag layer AGL (SIN) having the pressurized sintered structure but also by the Ag layer AGL having the non-pressurized sintered structure according to the semiconductor device of the present embodiment. Therefore, according to the present embodiment, since a volume of the Ag layer having the sintered structure, which contributes to the electric connection between the chip mounting part TAB and the semiconductor chip CHP1, can be increased, it becomes possible to reduce connection resistance between the chip mounting part TAB and the semiconductor chip CHP1. Consequently, according to the semiconductor device of the present embodiment, performance improvement of the semiconductor device can also be achieved.

As described above, according to the features of the present embodiment, it is possible not only to eliminate the room for improvements existing in the examination example but also to further have the above-mentioned advantages. Thus, it becomes possible to obtain remarkable effects that cannot be obtained by the semiconductor device of the examination example in that both of the reliability improvement and the performance improvement of the semiconductor device can be realized.

<Manufacturing Method of Semiconductor Device in Embodiment>

The semiconductor device according to the present embodiment is constituted as described above, and a manufacturing method thereof will be described below with reference to the drawing.

First, manufacturing steps of the semiconductor device according to the present embodiment will be simply described with reference to a flow chart and, then, detailed explanations will be given by reference to the drawings corresponding to the respective steps.

Figure 8:
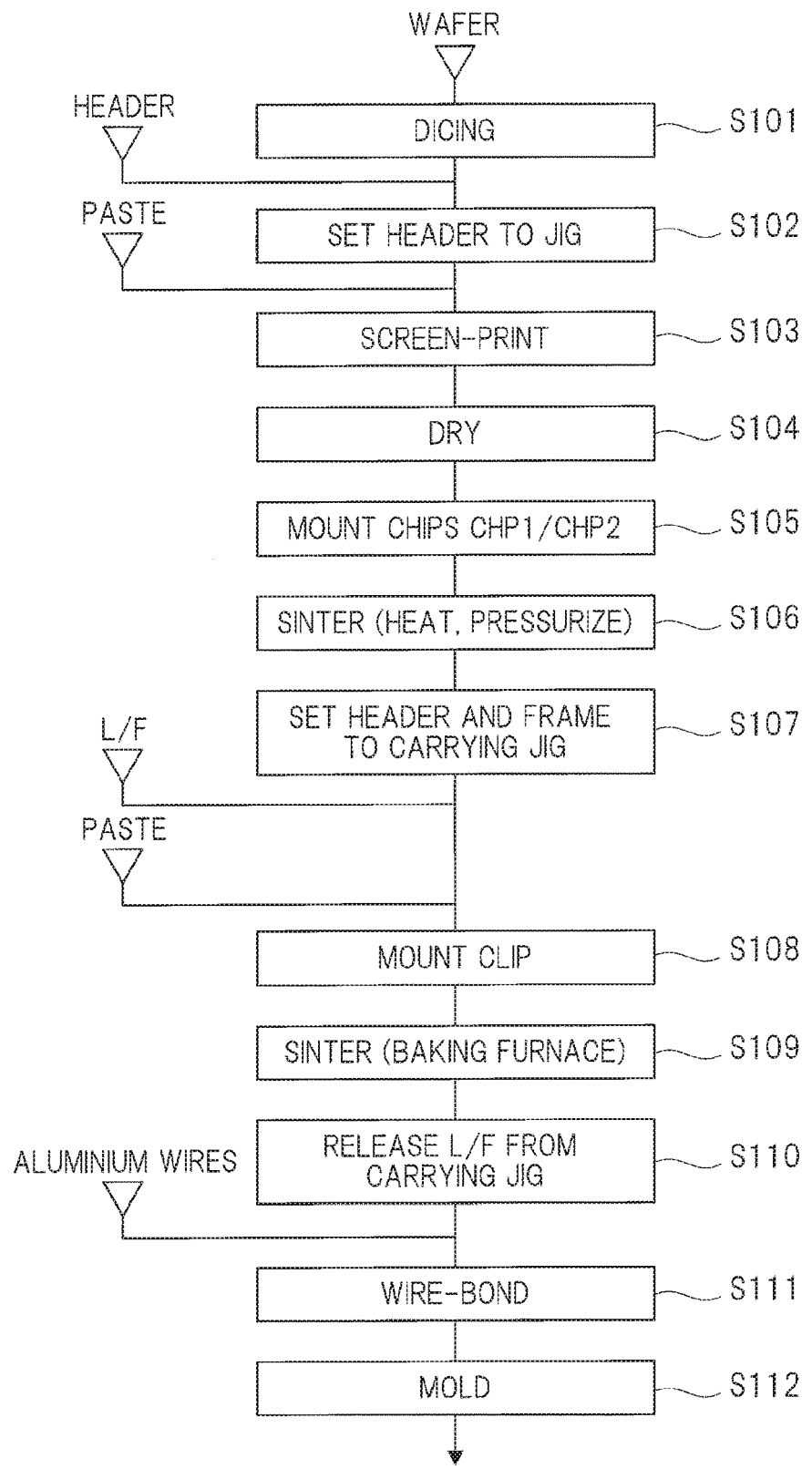
FIG. 8 is a flow chart showing a flow of manufacturing steps of the semiconductor device according to the embodiment.

FIG. 8 is a flow chart showing a flow of manufacturing steps of the semiconductor device in the present embodiment. In FIG. 8, a wafer on which integrated circuits are formed is prepared, a dicing process is performed onto this wafer, and thereby chip regions formed on the wafer are individuated, so that a plurality of semiconductor chips are acquired from the wafer (S101).

Next, a header to be a chip mounting part is prepared, and this header is set to a jig (S102). Thereafter, a paste whose solvent contains silver particles is applied onto the header by using, for example, a screen printing method (S103). Then, the paste applied to the header is dried to form an Ag layer in a porous state (S104).

Successively, after the semiconductor chip has been mounted on the Ag layer (S105), a heating process and a pressurizing process are applied onto the Ag layer, and thereby the Ag layer is sintered (S106). Thus, the Ag layer having a sintered structure can be formed.

Thereafter, a lead frame (L/F) is prepared, and the header and the lead frame are set onto a carrying jig (S107). Then the paste whose solvent contains silver particles is supplied onto the semiconductor chip and one portion of the leads formed on the lead frame, and a clip is mounted thereon via the paste so as to straddle the semiconductor chip and the leads (S108).

Next, the header and the lead frame set on the carrying jig are transported into a baking furnace, and are subjected to the heating process, and thereby the paste is sintered to form the Ag layer having a sintered structure (S109). Thus, the clip is electrically connected to the Ag layer having the sintered structure.

Successively, after the header and the lead frame have been taken out from the carrying jig (S110), electrode pads formed on the semiconductor chip and the leads are wire-bonded by aluminum wires so as to be electrically connected to each other (S111). Thereafter, the semiconductor chip is sealed by a sealing body made of a resin (S112). Thereafter, a lead molding step and a marking step are carried out. In ways as described above, the semiconductor device according to the present embodiment can be manufactured.

In the following description, the manufacturing steps of the semiconductor device according to the present embodiment will be concretely explained with reference to the drawings.

1. Chip Mounting Part Preparing Step of Chip Mounting Part

First, as shown in FIG. 9(a) and FIG. 9(a), a chip mounting part TAB is prepared. This chip mounting part TAB has, for example, a rectangular shape, and is formed by a material mainly composed of copper.

2. Chip Mounting Step

Next, as shown in FIG. 9(a) and FIG. 9(b), paste PST1 whose solvent contains silver particles is applied onto a chip mounting part TAB by using, for example, a screen printing method. That is, the paste PST1 whose solvent contains a plurality of Ag thin leaves is supplied onto the chip mounting part TAB. At this time, the paste PST1 is applied into a region on the chip mounting part TAB so as to have a plurality of substantially rectangular shapes, and a cutout portion NT is formed on one portion of corners of each of the applied substantially rectangular shapes.

Successively, as shown in FIGS. 10(a) and 10(b), the chip mounting part TAB onto which the paste PST1 has been applied is placed on a hot plate HP, and a heating process is carried out to the paste PST1. Thus, by drying the paste PST1, an Ag layer AGL in a porous state is formed. That is, the solvent in the paste PST1 is volatilized by heating the paste PST1, and the Ag layer AGL is formed on the chip mounting part TAB. This drying step is carried out in order to suppress the voids occurring between the semiconductor chip and the Ag layer by the volatilization of the residual solvent in the Ag layer after the semiconductor chip is mounted on the Ag layer. In this drying step, although the solvent causing the occurrence of voids is volatilized, the Ag layer AGL in the porous state is simultaneously formed, and thereby its tackiness (adhesiveness) is also lost.

Thereafter, as shown in FIG. 11(a) and FIG. 11(b), a temporarily fixing material TA is supplied so as to come in contact with the chip mounting part TAB. More specifically, as shown in FIG. 11(a), the temporarily fixing material TA is formed on the chip mounting part TAB and in the vicinity of a periphery of the cutout portion NT. The temporarily fixing material TA is composed of a material having tackiness. For example, a low melting-point solder paste having a melting point about 180° C., a volatile solvent having tackiness, a paste whose solvent contains silver particles, or the like may be used as the temporarily fixing material TA. In particular, as the paste whose solvent contains silver particles, a material similar to the paste PST1 applied onto the chip mounting part TAB may be also used, or a paste having an increased solvent component in comparison with the paste PST1 in order to increase tackiness may also be used.

Next, as shown in FIG. 12(a) and FIG. 12(b), the semiconductor chip CHP1 and the semiconductor chip CHP2 are mounted on the Ag layer AGL formed on the chip mounting part TAB. At this time, the plane size of the Ag layer AGL formed on the lower layer of the semiconductor chip CHP1 is made larger than the plane size of the semiconductor chip CHP1 so that one portion of the Ag layer AGL sticks out from the semiconductor chip CHP1 in a plan view. In the same manner, the plane size of the Ag layer AGL formed on the lower layer of the semiconductor chip CHP2 is made larger than the plane size of the semiconductor chip CHP2, so that one portion of the Ag layer AGL sticks out from the semiconductor chip CHP2 in a plan view. Moreover, in the present embodiment, the semiconductor chip CHKP1 is mounted on the Ag layer AGL so that one portion of the rear surface of the semiconductor chip CHP1 comes in contact with the temporarily fixing material TA. In the same manner, a semiconductor chip CHKP2 is mounted on the Ag layer AGL so that one portion of the rear surface of the semiconductor chip CHP2 comes in contact with the temporarily fixing material TA.

Thus, the semiconductor chip CHP1 and the semiconductor chip CHP2 are fixed by the temporarily fixing material TA having tackiness. Here, from the viewpoint of positively fixing the semiconductor chip CHP1, as shown in FIG. 12(a), a pair of cutout portions NT are provided at corner portions disposed on a diagonal line of the applied substantially rectangular shape, and the temporarily fixing materials TA are desirably formed on the paired cutout portions NT. In the same manner, from the viewpoint of positively fixing the semiconductor chip CHP2, as shown in FIG. 12(a), a pair of cutout portions NT are provided at corner portions disposed on a diagonal line of the applied substantially rectangular shape, and the temporarily fixing materials TA are desirably formed on the paired cutout portions NT.

In the present embodiment, as shown in FIG. 12(a), the semiconductor chip CHP1, on which the IGBT is formed, and the semiconductor chip CHP2, on which the diode is formed, are mounted on the chip mounting part TAB.

Here, the semiconductor chip CHP2 on which the diode is formed is disposed so that the cathode electrode pad formed on the rear surface of the semiconductor chip CHP2 comes in contact with the Ag layer AGL and the temporarily fixing material TA. As a result, the anode electrode pad formed on the surface of the semiconductor chip CHP2 is directed upward.

On the other hand, the semiconductor chip CHP1 on which the IGBT is formed is disposed so that the collector electrode formed on the rear surface of the semiconductor chip CHP1 comes in contact with the Ag layer AGL and the temporarily fixing material TA. Thus, the cathode electrode pad of the semiconductor chip CHP2 and the collector electrode of the semiconductor chip CHP1 are electrically connected to each other via the chip mounting part TAB. Moreover, the emitter electrode pad and the plurality of electrode pads (plurality of signal electrode pads) formed on the surface of the semiconductor chip CHP1 are directed upward.

Incidentally, regarding order of mounting the semiconductor chip CHP1 on which the IGBT is formed and the semiconductor CHP2 on which the diode is formed, the semiconductor chip CHP1 may be before CHP2 and the semiconductor chip CHP2 may be after CHP1, or the semiconductor chip CHP2 may be after CHP1 and the semiconductor chip CHP1 may be before CHP2.

Successively, as shown in FIG. 13(a) and FIG. 13(b), in a state where the chip mounting part TAB and the semiconductor chip CHP1 (CHP2) connected via the temporarily fixing material TA and the Ag layer AGL are sandwiched by press heads PH between which a cushion member CS is interposed, a heating process (about 250° C.) and a pressurizing process are carried out. Thus, the Ag layer AGL sandwiched by the semiconductor chip CHP1 and the chip mounting part TAB is sintered, so that an Ag layer AGL (SIN) having a pressurized sintered structure is formed. In the same manner, the Ag layer AGL sandwiched by the semiconductor chip CHP2 and the chip mounting part TAB is sintered, so that an AG layer AGL (SIN) having a pressurized sintered structure is formed. On the other hand, since not the pressurizing process but the heating process is carried out to the Ag layer AGL sticking out from the semiconductor chip CHP1, an Ag layer AGL having a non-pressurized sintered structure is formed. In the same manner, since not the pressurizing process but the heating process is carried out to the Ag layer AGL sticking out from the semiconductor chip CHP2, an Ag layer AGL having the non-pressurized sintered structure is formed. As described above, by applying heat and pressure onto the semiconductor chip CHP1 and the semiconductor chip CHP2, the collector electrodes of the semiconductor chip CHP1 and the Ag layers having the sintered structure (Ag layer AGL (SIN) each having the pressurized sintered structure+Ag layer AGL having the non-pressurized sintered structure) can be electrically connected to each other. In the same manner, the cathode electrodes of the semiconductor chip CHP2 and the Ag layers having the sintered structure (Ag layer AGL (SIN) having the pressurized sintered structure+Ag layer AGL having the non-pressurized sintered structure) can be electrically connected to each other.

Here, by carrying out the heating process and pressurizing process by the press heads PH, the temporarily fixing material TA becomes the following states depending on kinds of constituent materials. More specifically, for example, when the temporarily fixing material TA is composed of a low melting-point solder paste, the low melting-point solder paste is fused, and low melting-point solder remains after the heating process and the pressurizing process have been carried out. In this case, the chip mounting part TAB and the semiconductor chip CHP1 are electrically connected to each other by the Ag layer AGL (SIN) having the pressurized sintered structure, the Ag layer AGL having the non-pressurized sintered structure, and the low melting-point solder. On the other hand, for example, when the temporarily fixing material TA is composed of a volatile solvent, the volatile solvent is basically volatilized, and so the temporarily fixing material TA is lost. However, organic components (carbon components) contained in the volatile solvent sometimes remain as traces. Moreover, for example, when the temporarily fixing material TA is composed of a paste whose solvent contains silver particles, an Ag layer having a sintered structure is formed.

In particular, when the volatile solvent is used as the temporarily fixing material TA, the volatile solvent formed in the vicinity of the periphery of the cutout portion NT disappears, and so each of the rear surface of the semiconductor chip CHP1 and the rear surface of the semiconductor chip CHP2 has a portion that is not electrically connected to the Ag layer having the sintered structure (Ag layer AGL (SIN) having the pressurized sintered structure+Ag layer AGL having the non-pressurized sintered structure). That is, when the volatile solvent is used as the temporarily fixing material TA, a space is present in the vicinity of the periphery of the cutout portion NT. That is, the space is present between the portion not electrically connected to the Ag layer having the sintered structure on the rear surface of the semiconductor chip CH1 and the upper surface of the chip mounting part TAB, and a resin forming a sealing body to be formed in a step(s) described later is embedded in the space. In the same manner, a space is present between the portion not electrically connected to the Ag layer having the sintered structure on the rear surface of the semiconductor chip CHP2 and the upper surface of the chip mounting part TAB, and a resin forming a sealing body to be formed in a step(s) described later is embedded in the space.

3. Lead Frame Disposing Step

Next, as shown in FIG. 14(a) and FIG. 14(b), a lead frame LF is prepared. A plurality of leads LD1 and a plurality of leads LD2 are formed on the lead frame LF.

Thereafter, as shown in FIG. 14(b), the lead frame LF is disposed, by using a jig JG, above the chip mounting part TAB on which the semiconductor chip CHP1 and the semiconductor chip CHP2 are mounted. At this time, the semiconductor chip CHP1 on which the IGBT is formed is disposed at a position close to the leads LD2, and the semiconductor chip CHP2 on which the diode is formed is disposed at a position close to the lead LD1. That is, in a plan view, the semiconductor chip CHP2 is mounted so as to be sandwiched between the lead LD1 and the semiconductor chip CHP1, and the semiconductor chip CHP1 is disposed so as to be sandwiched between the leads LD2 and the semiconductor chip CHP2. Moreover, the emitter electrode pad of the semiconductor chip CHP1 on which the IGBT is formed is disposed on a lead LD1 side, and the plurality of electrode pads (signal electrode pads) thereof are disposed on a leads LD2 side. By this disposition relationship, the lead frame LF is disposed above the chip mounting part TAB on which the semiconductor chip CHP1 and the semiconductor chip CHP2 are mounted.

4. Electrical Connection Step

Successively, for example, a paste whose solvent contains silver particles is formed on the anode electrode pad of the semiconductor chip CHP2. Thereafter, for example, a paste whose solvent contains silver particles is formed also on the emitter electrode pad of the semiconductor chip CHP1. Moreover, for example, a paste whose solvent contains silver particles is formed also on one portion of a region of the lead LD1. That is, the lead LD1 has a lead post part to which a clip to be described later can be connected, and the paste whose solvent contains silver particles is formed on this lead post part. This paste may have the same material component as that of the paste PST1 shown in FIG. 9, or may have a different material component.

Thereafter, as shown in FIG. 15(a) and FIG. 15(b), a clip CLP is prepared, and the clip CLP is mounted over on the lead LD1, the semiconductor chip CHP2, and the semiconductor chip CHP1. More specifically, the clip CLP is disposed via the paste whose solvent contains silver particles so as to straddle the lead LD1, the semiconductor chip CHP2, and the semiconductor chip CHP1 on them. That is, in a plan view, the clip CLP is disposed via the paste so as to overlap the emitter electrode pad of the semiconductor chip CH1, the anode electrode pad of the semiconductor chip CHP2, and one portion (lead post part) of the lead LD1.

In this manner, the clip CLP is disposed via the paste so as to straddle the lead LD1, the semiconductor chip CHP2, and the semiconductor chip CHP1 on them, and thereby a heating process (baking process) is carried out. Thus, the solvent component is volatilized from the paste, and an Ag layer AGL having a non-pressurized sintered structure is formed. In other words, since the pressurizing process is not carried out in this step, the paste becomes the Ag layer AGL having the non-pressurized sintered structure. As described above, the lead LD1, the anode electrode pad formed on the semiconductor chip CHP2, and the emitter electrode pad formed on the semiconductor chip CHP1 are electrically connected to the clip CLP through the Ag layer AGL having the non-pressurized sintered structure.

Next, a wire-bonding step for connecting the semiconductor chip CHP1 and the leads LD2 by the wires W is carried out. More specifically, as shown in FIG. 16(a) and FIG. 16(b), the signal electrode pads formed on the surface of the semiconductor chip CHP1 and the leads LD2 (signal leads) formed on the lead frame LF are connected to each other with the wires W each made of, for example, aluminum. Thus, the wire-bonding step is carried out. At this time, in the present embodiment, since the leads LD2 are disposed opposite the lead LD1 to which the clip CLP is connected, the wire-bonding step can be carried out without taking interference due to the clip CLP into consideration. Then, by removing the jig JG, the wire-bonding step is completed.

5. Sealing (Molding) Step

Successively, as shown in FIG. 17(a) and FIG. 17(b), the semiconductor chip CHP1, the semiconductor chip CHP2, one portion of the chip mounting part TAB, one portion of the lead LD1, each one portion of the plurality of leads LD2, the clip CLP, and the wires W are sealed, and the sealing body MR made of, for example, a resin is formed. Here, in the present embodiment as shown in FIG. 6, the sealing body MR is formed so as to cover the Ag layer AGL having the non-pressurized sintered structure formed over from on the chip mounting part TAB to the end-portion side face of the semiconductor chip CHP1. At this time, since the density of the Ag layer AGL having the non-pressurized sintered structure is lower than the density of the Ag layer AGL having the pressurized sintered structure, one portion of the resin constituting the sealing body MR permeates among Ag particles (among the plurality of Ag thin leaves) inside the Ag layer AGL having the non-pressurized sintered structure.

Incidentally, the sealing body MR has: an upper surface; a lower surface opposite to the upper surface; a first side face located between the upper surface and the lower surface in its thickness direction; and a second side face opposing the first side face. In FIG. 17(a), a side S1 of the first side face, and a side S2 of the second side face are shown. Moreover, in the sealing body MR, the lead LD1 protrudes from the first side face (side S1) of the sealing body MR, and the plurality of leads LD2 protrude from the second side face (side S2) of the sealing body MR.

6. Exterior Plating Step

Thereafter, although not shown in the drawings, a tie bar provided to the lead frame LF is cut. Then, a plated layer serving as a conductor film is formed on the tip mounting part TAB, the surfaces of the one portion of the lead LD1, and the surfaces of the one portions of the leads LD2 exposed from the lower surface of the sealing body MR. That is, the plated layer is formed on the portion of the lead LD1 exposed from the sealing body MR, each portion of the plurality of leads LD2 exposed from the sealing body MR, and the lower surface of the chip mounting part TAB.

7. Marking Step

Next, information (marks) such as product names and serial numbers is formed on the surface of the sealing body MR made of a resin. Incidentally, as a forming method of the marks, a method of printing letters by a printing system or a method of engraving the marks by irradiating the surface of the sealing body with a laser beam can be used.

8. Individuating Step

Successively, by cutting the one portion of the lead LD1 and the one portion of each of the plurality of leads LD2, the lead LD1 and the plurality of leads LD2 are separated from the lead frame LF. Thus, the semiconductor device according to the present embodiment can be manufactured. Thereafter, the lead LD1 and the plurality of leads LD2 are respectively molded. Moreover, for example, after carrying out a testing process for testing electrical characteristics thereof, semiconductor devices determined as good products are shipped. As described above, the semiconductor device according to the present embodiment can be manufactured.

<Features of Manufacturing Method of Semiconductor Device in Embodiment>

Next, described will be a basic idea about a manufacturing method of the present embodiment. The basic idea about the manufacturing method of the present embodiment lies in that the semiconductor chip mounted on the Ag layer is fixed by using a temporarily fixing material having tackiness without forming the temporarily fixing material on the surface of the Ag layer having a porous structure as many as possible. That is, in the present embodiment, when the semiconductor chip is simply mounted on the Ag layer having the porous structure, the positional deviation of the semiconductor chip tends to easily occur since no tackiness is present on the Ag layer of the porous structure. By taking the above into consideration, it is thought that the semiconductor chip is fixed by using a temporarily fixing material having tackiness. However, in the present embodiment, the following is considered: when the temporarily fixing material is supplied onto the surface of the Ag layer having the porous structure, the temporarily fixing material enters and spreads into (permeates) the Ag layer having the porous structure, and so an amount of the temporarily fixing material that makes a contribution for holding the position of the semiconductor chip does not stabilize, which cannot effectively suppress the positional deviation of the semiconductor chip. Moreover, in the present embodiment, the solvent component of the temporarily fixing material permeated into the Ag layer is volatilized by the heating step and the pressurizing step carried out after the semiconductor chip mounting step. However, there is no leak path for the volatilized solvent component, and so it is also considered that the volatilized solvent is trapped in the lower layer of the semiconductor chip, which becomes a factor of the occurrence of voids. Thus, in the present embodiment, by taking these points into consideration, given a contrivance for embodying the basic idea that the semiconductor chip mounted on the Ag layer is fixed by using the temporarily fixing material having tackiness without forming the temporarily fixing material on the surface of the Ag layer having the porous structure as many as possible.

In order to realize the above-mentioned basic idea, the present embodiment has features in that: the temporarily fixing material is supplied so as to have a portion contacting with the chip mounting part; and the semiconductor chip is mounted on the Ag layer so that one portion of the rear surface of the semiconductor chip comes in contact with the temporarily fixing material. Thus, according to the present embodiment, since it is avoided to form the entire temporarily fixing material on the surface of the Ag layer, permeation of the temporarily fixing material into the Ag layer can be suppressed in comparison with a case of forming the entire temporarily fixing material on the surface of the Ag layer. As a result, according to the present embodiment, it is possible to suppress the positional deviation of the semiconductor chip and the occurrence of voids caused by the permeation of the temporarily fixing material into the Ag layer. Consequently, the reliability of the semiconductor device in the present embodiment can be improved.

In the following description, described below will be a configuration example that embodies the features of the present embodiment. FIG. 18(a) and FIG. 18(b) are schematic views showing a state in which the semiconductor chip CHP1 is fixed by the temporarily fixing material TA formed on the tip mounting part TAB. In particular, FIG. 18(a) is an enlarged plan view schematically showing the state in which the semiconductor chip CHP1 is fixed by the temporarily fixing material TA formed on the tip mounting part TAB, and FIG. 18(b) is a cross-sectional view taken along line A-A of FIG. 18(a).

In FIG. 18(a), an Ag layer AGL in a porous state, which is dried by a drying step, is formed on the chip mounting part TAB, and the semiconductor chip CHP1 is mounted on this Ag layer AGL. Moreover, in a plan view, the temporarily fixing material TA is formed at a position overlapping a corner portion CNR constituted by a region of the vicinity of an intersection that mutually intersects the side SD1 and the side SD2 of the semiconductor chip CHP1, and the semiconductor chip CHP1 is mounted on the Ag layer AGL so that the corner portion CNR of the semiconductor chip CHP1 and the temporarily fixing material TA comes in contact with each other. More specifically, as shown in FIG. 18(a), at a plane position corresponding to the corner portion CNR of the semiconductor chip CHP1, a cutout portion NT1 is formed on the Ag layer AGL formed on the lower layer of the semiconductor chip CHP1. Moreover, the temporarily fixing material TA is formed at the cutout portion NT1.

That is, in the present embodiment, the cutout portion NT1 is formed on the Ag layer AGL, and the temporarily fixing material TA is formed on the upper surface of the chip mounting part TAB exposed from the cutout portion NT1. Then, the temporarily fixing material TA, which is formed so as to come in contact with the upper surface of the chip mounting part TAB exposed from the cutout portion NT1, and the semiconductor chip mounted on the Ag layer AGL are in contact with each other. Therefore, in a plan view seen from the surface of the semiconductor chip CHP1, the corner portion CNR of the semiconductor chip CHP1 does not overlap the Ag layer AGL, and the temporarily fixing material TA is formed on the chip mounting part TAB including this non-overlapped region.

Thus, according to the configuration example shown in FIG. 18(a) and FIG. 18(b), it is found that the following features of the present embodiment are realized, the features being that the temporarily fixing material TA is supplied so as to have a portion contacting with the chip mounting part TAB, and that the semiconductor chip CHP1 is mounted on the Ag layer AGL so that the one portion of the rear surface of the semiconductor chip CHP1 comes in contact with the temporarily fixing material TA. In particular, in the configuration example shown in FIG. 18(a) and FIG. 18(b), the temporarily fixing material TA is in contact with the side face of the Ag layer AGL, but is out of contact with the surface of the Ag layer AGL at all, so that it is possible to effectively suppress the permeation of the temporarily fixing material TA into the Ag layer AGL. As a result, according to the configuration example shown in FIG. 18(a) and FIG. 18(b), it is possible to increase the effect for suppressing the positional deviation of the semiconductor chip and the occurrence of voids therein caused by the permeation of the temporarily fixing material TA into the Ag layer AGL.

Here, when the temporarily fixing material TA is in contact with the side face of the Ag layer AGL, the solvent component of the temporarily fixing material TA is considered to permeate from the side face of the Ag layer AGL. Therefore, from the viewpoint of further effectively suppressing the permeation of the temporarily fixing material TA into the Ag layer AGL, in the configuration example of FIG. 18(a) and FIG. 18(b), it is preferably considered to have such a configuration that the temporarily fixing material TA is also out of contact with the side face of the Ag layer AGL.

However, the basic idea in the present embodiment is not limited to this, and the temporarily fixing material TA may be in contact with the side face of the Ag layer AGL. This reason is as follows: the slight permeation into the AG layer AGL is considered to occur in a case of this configuration, but the amount of permeation of the temporarily fixing material into the Ag layer can be reduced in comparison with a configuration of forming the entire temporarily fixing material on the surface of the Ag layer.

Here, when the temporarily fixing material TA is in contact with the side face of the Ag layer AGL, it is important to stabilize the amount of the temporarily fixing material TA, which makes a contribution for holding the position of the semiconductor chip CHP1, by reducing the amount of permeation of the solvent component contained in the temporarily fixing material TA into the side face of the Ag layer AGL as much as possible. For this reason, when the temporarily fixing material AT comes in contact with the side face of the Ag layer AGL, a contact area between the temporarily fixing material TA and the side face of the Ag layer AGL is desirably set to be as small as possible immediately after a step for supplying the temporarily fixing material TA. For example, immediately after the step for supplying the temporarily fixing material TA, an area of the portion at which the temporarily fixing material TA is made in contact the chip mounting part TAB is desirably made larger than an area of a portion at which the temporarily fixing material TA is in contact with the side face of the Ag layer AGL. In addition, not only immediately after the step for supplying the temporarily fixing material TA but also during the semiconductor chip mounting step thereafter, it is desirable to stabilize the amount of the temporarily fixing material TA, and so the area of the portion at which the temporarily fixing material TA is made in contact the chip mounting part TAB is desirably larger than the area of the portion at which the temporarily fixing material TA is in contact with the side face of the Ag layer AGL.

Incidentally, in the present embodiment, as shown in FIG. 18(b), the corner portion CNR of the semiconductor chip CHP1 does not overlap the Ag layer AGL, and the temporarily fixing material TA is formed on the chip mounting part TAB including this non-overlapped region. That is, as shown in FIG. 18(a), as the result that the cutout portion NT1 is formed on the Ag layer AGL, a gap is formed between the corner portion CNR of the semiconductor chip CHP1 and the chip mounting part TAB corresponding to the cutout portion NT1, and the temporarily fixing material TA is filled into the gap (see FIG. 18(b)). Therefore, as shown in FIG. 18(b), in the chip mounting step, the semiconductor chip CHP1 is fixed by the temporarily fixing material TA. Thereafter, the heating step and the pressurizing step are carried out to make the Ag layer AGL an Ag layer having a sintered structure. At this time, for example, when the temporarily fixing material TA is formed of a volatile solvent, the temporarily fixing material TA is volatilized if the heating step and the pressurizing step are carried out. As a result, the gap is generated at a position where the temporarily fixing material TA has been filled between the corner portion CNR of the semiconductor chip CHP1 and the chip mounting part TAB. In this gap, for example, as shown in FIG. 19, one portion of the resin forming the sealing body MR is filled by a resin sealing step (molding step) carried out after a subsequent step. That is, when the temporarily fixing material TA is formed of a volatile solvent, as shown in FIG. 19, the one portion of the sealing body MR is embedded in the gap generated between the corner portion CNR of the semiconductor chip CHP1 and the upper surface of the chip mounting part TAB after the molding step.

<Modified Example 1>

The feature of the embodiment lies in that: the temporarily fixing material is supplied so as to have the portion contacting with the chip mounting part; and the semiconductor chip is mounted on the Ag layer so that the one portion of the rear surface of the semiconductor chip comes in contact with the temporarily fixing material. Described below will be modified example 1 that is one example of a configuration for realizing the feature.

FIG. 20(a) and FIG. 20(b) are schematic views showing a state in which the semiconductor chip CHP1 is fixed by the temporarily fixing material TA formed on the chip mounting part TAB in the present modified example 1. In particular, FIG. 20(a) is an enlarged plan view schematically showing the state in which the semiconductor chip CHP1 is fixed by the temporarily fixing material TA formed on the chip mounting part TAB, and FIG. 20(b) is a cross-sectional view taken along line A-A of FIG. 20(a).

As shown in FIG. 20(a) in the present modified example 1, a cutout portion NT1 is formed at a plane position corresponding to the corner portion CNR of the semiconductor chip CHP1 and on the Ag layer AGL formed on the lower layer of the semiconductor chip CHP1. Moreover, as shown in FIG. 20(b), a temporarily fixing material TA is formed on the upper surface of the chip mounting part TAB exposed from this cutout portion NT2, and further one portion of the temporarily fixing material TA is also formed on the surface of the Ag layer AGL.

The present modified example 1 configured in this manner is different from the embodiment shown in FIG. 18(a) and FIG. 18(b), and the one portion of the temporarily fixing material TA is also formed on the surface of the Ag layer AGL. However, also in this case, since the entire temporarily fixing material TA is not formed on the surface of the Ag layer AGL, the permeation of the temporarily fixing material TA into the Ag layer AGL can be suppressed in comparison with the case in which the entire temporarily fixing material TA is formed on the surface of the Ag layer AGL. As a result, according to the present modified example 1, it is possible to suppress the positional deviation of the semiconductor chip CHP1 and the occurrence of voids caused by the permeation of the temporarily fixing material TA into the Ag layer AGL, and to thereby improve the reliability of the semiconductor device in the present embodiment.

In particular, in the present modified example 1, the one portion of the temporarily fixing material TA is formed on the surface of the Ag layer AGL, but a region in which the one portion of the temporarily fixing material TA is formed is a region surrounding the vicinity of the end portion of the Ag layer AGL. For this reason, even when there is permeation of the solvent component contained in the temporarily fixing material TA into the Ag layer AGL, the solvent component permeated therein can be easily volatilized from the side faces of the Ag layer AGL, and consequently the occurrence of voids can be suppressed.

However, when the one portion of the temporarily fixing material TA is in contact with the surface of the Ag layer AGL similarly to the present modified example 1, it is important to stabilize the amount of the temporarily fixing material TA making the contribution for holding the position of the semiconductor chip CHP1 by reducing the amount of permeation of the solvent component contained in the temporarily fixing material TA from the surface of the Ag layer AGL as much as possible. For this reason, when the one portion of the temporarily fixing material TA comes in contact with the surface of the Ag layer AGL, it is desirable to make the contact area between the one portion of the temporarily fixing material TA and the surface of the Ag layer AGL as small as possible immediately after the step of supplying the temporarily fixing material TA. For example, immediately after the step for supplying the temporarily fixing material TA, an area (S1) of a portion of the temporarily fixing material TA contacting with the chip mounting part TAB is desirably made larger than an area (S2) of the portion of the temporarily fixing material TA contacting with the surface of the Ag layer AGL. Incidentally, not only immediately after the step for supplying the temporarily fixing material TA but also during the semiconductor chip mounting step thereafter, it is desirable to stabilize the amount of the temporarily fixing material TA, and so the area (S1) of the portion of the temporarily fixing material TA contacting with the chip mounting part TAB is desirably made larger than the area (S2) of the portion of the temporarily fixing material TA contacting with the surface of the Ag layer AGL.

<Modified Example 2>

The feature of the embodiment lies in that: the temporarily fixing material is supplied so as to have a portion contacting with the chip mounting part; and the semiconductor chip is mounted on the Ag layer so that one portion of the rear surface of the semiconductor chip comes in contact with the temporarily fixing material. Described below will be modified example 2 that is another example of a configuration for realizing the feature.

FIG. 21(a) and FIG. 21(b) are schematic views showing a state in which the semiconductor chip CHP1 is fixed by the temporarily fixing material TA formed on the chip mounting part TAB in the present modified example 2. In particular, FIG. 21(a) is an enlarged plan view that schematically shows the state in which the semiconductor chip CHP1 is fixed by the temporarily fixing material TA formed on the chip mounting part TAB, and FIG. 21(b) is a cross-sectional view taken along line A-A of FIG. 21(a).

In the present modified example 2, as shown in FIG. 21(a), no cutout portion is formed at a plane position corresponding to the corner portion CNR of the semiconductor chip CHP1 and in the Ag layer AGL formed on the lower layer of the semiconductor chip CHP1. Moreover, as shown in FIG. 21(b), the Ag layer AGL has a portion that sticks out from the corner portion CNR of the semiconductor chip CHP1. As a result, in the present modified example 2, the temporarily fixing material TA is formed on the upper surface of the chip mounting part TAB, and moreover the one portion of the temporarily fixing material TA is also formed on the surface of the Ag layer AGL.

The present modified example 2 configured in this manner is different from the embodiment shown in FIG. 18(a) and FIG. 18(b), and the one portion of the temporarily fixing material TA is also formed on the surface of the Ag layer AGL. In particular, in the present modified example 2, the area (S1) of a portion of the temporarily fixing material TA made contacting with the chip mounting part TAB is smaller than the area (S2) of the portion of the temporarily fixing material TA contacting with the surface of the Ag layer AGL. However, also in this case, since the entire temporarily fixing material TA is not formed on the surface of the Ag layer AGL, the permeation of the temporarily fixing material TA into the Ag layer AGL can be suppressed in comparison with the case in which the entire temporarily fixing material TA is formed on the surface of the Ag layer AGL. As a result, according to the present modified example 2, it is possible to suppress the positional deviation of the semiconductor chip CHP1 and the occurrence of voids caused by the permeation of the temporarily fixing material TA into the Ag layer AGL, and to thereby improve the reliability of the semiconductor device in the present embodiment.

In particular, in the present modified example 2 similarly to the modified example 1, the one portion of the temporarily fixing material TA is formed on the surface of the Ag layer AGL, but the region in which the one portion of the temporarily fixing material TA is formed is a region surrounding the vicinity of the end portion of the Ag layer AGL. For this reason, even when there is the permeation of the solvent component contained in the temporarily fixing material TA into the Ag layer AGL, the solvent component permeated therein can be easily volatilized from the side faces of the Ag layer AGL, and consequently the occurrence of voids can be suppressed.

Incidentally, no cutout portion is provided on the Ag layer AGL in the present modified example 2, and the Ag layer AGL has a portion that sticks out from the corner portion CNR of the semiconductor chip CHP1. That is, according to the present modified example 2, in a plan view, the Ag layer AGL of the lower layer sticks out from the side S1 and side S2 of the semiconductor chip CHP1, and the Ag layer AGL of the lower layer also sticks out from the corner portion CNR of the semiconductor chip CHP1. This means that, according to the configuration of the present modified example 2, the structure shown in FIG. 6 is realized even at the corner portion CNR of the semiconductor chip CHP1. Moreover, according to the structure shown in FIG. 6, the stress concentration onto the semiconductor chip CHP1 can be suppressed. Therefore, according to the present modified example 2 in which the structure shown in FIG. 6 is applied to the corner portion CNR of the semiconductor chip CHP1 and the stress concentration tends to occur at the corner portion, the effect for suppressing the stress concentration onto the corner portion of the semiconductor chip CHP1 can be obtained.

In the foregoing, the invention made by the inventors of the present invention has been concretely described based on the embodiments. However, it is needless to say that the present invention is not limited to the foregoing embodiments and various modifications and alterations can be made within the scope of the present invention.

EXPLANATION OF REFERENCE NUMERALS

AGL Ag layer
CHP1 semiconductor chip
CHP2 semiconductor chip
LD1 lead
LD2 lead
LF lead frame
PST1 paste
TA temporarily fixing material
TAB chip mounting part

The invention claimed is:

1. A manufacturing method of a semiconductor device, the method comprising:
   (a) preparing a lead frame having a chip mounting part and a plurality of leads;
   (b) supplying, onto the chip mounting part, a first paste whose first solvent contains a plurality of first Ag thin leaves;
   (c) heating the first paste to volatilize the first solvent in the first paste, and forming a first Ag layer on the chip mounting part;
   (d) mounting a semiconductor chip onto the first Ag layer on the chip mounting part, the semiconductor chip including a surface on which a first electrode pad is formed, and a rear surface which is a surface opposite to the surface and on which a second electrode is formed; and
   (e) applying heat and pressure onto the semiconductor chip after the (d), and electrically connecting the second electrode of the semiconductor chip and the first Ag layer,
   wherein the (d) comprises:
   (d1) supplying a material so as to come in contact with the chip mounting part; and
   (d2) mounting the semiconductor chip on the first Ag layer so that one portion of the rear surface of the semiconductor chip comes in contact with the material,
   wherein, after the (d1), an area of a portion of the material contacting with the chip mounting part is larger than an area of a portion of the material contacting with the first Ag layer.

2. The manufacturing method of a semiconductor device according to claim 1, wherein the rear surface of the semiconductor chip includes:
   a first side;
   a second side intersecting with the first side; and
   a corner portion constituted by the first side and the second side, and
   wherein the (d2) mounts the semiconductor chip on the first Ag layer so that the corner portion of the semiconductor chip is in contact with the material.

3. The manufacturing method of a semiconductor device according to claim 1, wherein, after the (e), the material does not remain on the chip mounting part.

4. The manufacturing method of a semiconductor device according to claim 3, wherein the material comprises a volatile material.

5. The manufacturing method of a semiconductor device according to claim 1, further comprising:
(f) after the (e), supplying a second paste onto the first electrode pad of the semiconductor chip and one portion of a first lead among the plurality of leads, a second solvent of the second paste containing a plurality of second Ag thin leaves;
(g) after the (f) mounting a conductor plate on the semiconductor chip and the first lead so as to come in contact with the second paste on the first electrode pad and the second paste on the first lead; and
(h) after the (g), heating the second paste, volatilizing the second solvent in the second paste to form a second Ag layer, electrically connecting the conductor plate to the first electrode pad of the semiconductor chip and the first lead via the second Ag layer.

6. The manufacturing method of a semiconductor device according to claim 1, wherein the semiconductor chip includes an insulating gate bipolar transistor,
wherein the first electrode pad comprises an emitter electrode of the insulating gate bipolar transistor, and
wherein the second electrode comprises a collector electrode of the insulating gate bipolar transistor.

7. A semiconductor device, comprising:
a semiconductor chip including a surface on which a first electrode pad is formed, and a rear surface which is a surface opposite to the surface and on which a second electrode is formed;
a chip mounting part including a first main surface on which the semiconductor chip is mounted, and a second main surface that is a surface opposite to the first main surface;
a first lead electrically connected to the first electrode pad of the semiconductor chip via a conductor plate; and
a sealing body resin-sealing the semiconductor chip and the conductor plate,
wherein the second electrode of the semiconductor chip is electrically connected to the first main surface of the chip mounting part through a first Ag layer formed by a plurality of first Ag thin leaves, and
wherein, in a plan view seen from the surface of the semiconductor chip, a first Ag density at a first portion of the first Ag layer overlapping the semiconductor chip is higher than a first Ag density at a second portion of the first Ag layer not overlapping the semiconductor chip.

8. The semiconductor device according to claim 7, wherein the rear surface of the semiconductor chip includes a portion not electrically connected to the first Ag layer.

9. The semiconductor device according to claim 8, wherein one portion of the sealing body is disposed between a portion on the rear surface of the semiconductor chip not electrically connected to the first Ag layer and the first main surface of the chip mounting part.

10. The semiconductor device according to claim 7, wherein the rear surface of the semiconductor chip includes:
a first side;
a second side intersecting with the first side; and
a corner portion constituted by the first side and the second side, and
wherein, in a plan view seen from the surface of the semiconductor chip, the corner portion of the semiconductor chip does not overlap the first Ag layer.

11. The semiconductor device according to claim 10, wherein one portion of the sealing body is disposed between the corner portion of the semiconductor chip and the first main surface of the chip mounting part.

12. The semiconductor device according to claim 7, wherein one portion of the sealing body permeates between the plurality of first Ag thin leaves and the second portion of the first Ag layer.

13. The semiconductor device according to claim 7, wherein the second portion of the first Ag layer includes a portion thicker in thickness than the first portion of the first Ag layer.

14. The semiconductor device according to claim 7, wherein a plated layer electrically connected to the first Ag layer is formed on the first main surface of the chip mounting part.

15. The semiconductor device according to claim 14, wherein the plated layer comprises an Ag plated layer, and an Ag density of the Ag plated layer is higher than the first Ag density at the first portion of the first Ag layer.

16. The semiconductor device according to claim 7, wherein the conductor plate is electrically connected to the first electrode pad of the semiconductor chip and the first lead through a second Ag layer formed by a plurality of second Ag thin leaves.

17. The semiconductor device according to claim 7, wherein an Au film electrically connected to the first Ag layer is formed on the rear surface of the semiconductor chip.

18. The semiconductor device according to claim 7, wherein the semiconductor chip includes an insulating gate bipolar transistor, and
wherein the first electrode pad is electrically connected to an emitter electrode of the insulating gate bipolar transistor, and the second electrode is electrically connected to a collector electrode of the insulating gate bipolar transistor.

* * * * *